(12) United States Patent
Kim et al.

(10) Patent No.: US 11,004,274 B2
(45) Date of Patent: May 11, 2021

(54) ENERGY MANAGEMENT APPARATUS AND OPERATING METHOD THEREOF

(71) Applicant: LG ELECTRONICS INC., Seoul (KR)

(72) Inventors: Haengwoon Kim, Seoul (KR); Wookjin Park, Seoul (KR); Eunjung Suh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/480,201

(22) PCT Filed: Jan. 16, 2018

(86) PCT No.: PCT/KR2018/000764
§ 371 (c)(1),
(2) Date: Jul. 23, 2019

(87) PCT Pub. No.: WO2018/139799
PCT Pub. Date: Aug. 2, 2018

(65) Prior Publication Data
US 2019/0371081 A1 Dec. 5, 2019

(30) Foreign Application Priority Data
Jan. 26, 2017 (KR) .................. 10-2017-0012894

(51) Int. Cl.
*G06T 19/20* (2011.01)
*G06F 3/0486* (2013.01)
*G01R 21/133* (2006.01)

(52) U.S. Cl.
CPC ............ *G06T 19/20* (2013.01); *G06F 3/0486* (2013.01); *G01R 21/133* (2013.01); *G06T 2200/24* (2013.01); *G06T 2219/2016* (2013.01)

(58) Field of Classification Search
CPC ...... G06T 11/206; G06Q 30/06; G06Q 40/04; G09G 5/222; G06F 3/04845
See application file for complete search history.

(56) References Cited

U.S. PATENT DOCUMENTS 6,449,761 B1 * 9/2002 Greidinger ............ G06F 30/392
716/122
2005/0265580 A1 * 12/2005 Antonucci ......... G06K 9/00342
382/103

(Continued)

FOREIGN PATENT DOCUMENTS

EP 3029805 A1 6/2016
JP 2000-193695 A 7/2000

(Continued)

*Primary Examiner* — Todd Buttram
(74) *Attorney, Agent, or Firm* — Dentons US LLP

(57) ABSTRACT

An energy management apparatus according to an embodiment of the present invention is designed to provide a method for visually displaying an energy operation status in various manners so as to facilitate energy analysis, and may comprise: a measurement unit for acquiring power state information of at least one energy apparatus constituting a system to which the energy management apparatus belongs; a control unit for analyzing an energy operation status on the basis of the acquired power state information; and a display unit for displaying the analyzed energy operation status in the form of a three-dimensional energy graph, wherein each of the X-, Y-, and Z-axes of the three-dimensional energy graph is mapped to one of time, an energy apparatus, and an object of energy analysis.

13 Claims, 23 Drawing Sheets

(56) References Cited

U.S. PATENT DOCUMENTS

| | | | |
|---|---|---|---|
| 2009/0234146 A1* | 9/2009 | Cooney | C12M 47/06 554/174 |
| 2010/0005411 A1 | 1/2010 | Duncker et al. | |
| 2011/0131253 A1* | 6/2011 | Peukert | G06F 16/211 707/805 |
| 2013/0184885 A1 | 7/2013 | Keil et al. | |
| 2014/0285528 A1* | 9/2014 | Yoshizawa | G06T 3/00 345/676 |
| 2015/0067568 A1* | 3/2015 | Lee | G06F 3/04842 715/771 |
| 2015/0242783 A1* | 8/2015 | Sasaki | G06T 11/206 705/7.24 |
| 2016/0093074 A1* | 3/2016 | Inoue | G05F 1/66 345/427 |
| 2017/0212668 A1* | 7/2017 | Shah | G06T 11/206 |
| 2018/0214603 A1* | 8/2018 | Huang | A61F 2/0063 |
| 2019/0293559 A1* | 9/2019 | Ogawa | G01N 21/55 |

FOREIGN PATENT DOCUMENTS

| | | | | |
|---|---|---|---|---|
| JP | 201273776 A | 4/2012 | | |
| JP | 2013-229995 A | 11/2013 | | |
| JP | 2016-066288 A | 4/2016 | | |
| KR | 10-1447635 B1 | 10/2014 | | |
| KR | 10-2016-0036598 A | 4/2016 | | |
| KR | 20160036598 A | * 4/2016 | | G05B 15/02 |
| WO | 2011049383 A2 | 4/2011 | | |

* cited by examiner

ENERGY MANAGEMENT APPARATUS AND OPERATING METHOD THEREOF

This application is a National Phase application of International Application No. PCT/KR2018/000764, filed Jan. 16, 2018, and claims the benefit of KR Patent Application No. 10-2017-0012894 filed on Jan. 26, 2017, all of which are hereby incorporated by reference in their entirety for all purposes as if fully set forth herein.

TECHNICAL FIELD

The present invention relates to an energy management apparatus and a method of operating the same and, more particularly, to an energy management apparatus configuring a smart grid and a method of operating the same.

BACKGROUND ART

Currently, a power system (power grid) for supplying power to home or offices is managed by a vertical centralized network controlled by a producer. Specifically, the supplier simply supplied an energy source such as electricity, water, gas, etc. and consumers simply used the received energy source. Accordingly, it is difficult to efficiently manage energy generation, distribution or use.

That is, the power system has a radial structure spreading from a center to the periphery to distribute energy from an energy supplier to a plurality of places of use and is centered on a one-way supplier, not on consumers.

In addition, the price information of electricity is not checked in real time, but is only checked through a power exchange. In addition, since a substantially fixed price system is used, incentives for consumers through price change cannot be used.

In such a power system, it is impossible to solve a global problem such as global warming prevention, absence of a method of coping with increase in price of raw materials of energy, an energy overconsumption suppression problem, and a stable power supply problem.

Accordingly, in order to emerge from a current power system and improve efficiency of the electricity industry through establishment of a bidirectional information transmission system between a consumer and a supplier, it is necessary to develop a smart grid. Further, it is necessary to establish a smart grid for enabling consumers to control their power demands and to develop an energy management apparatus capable of performing bidrectional communication with such a smart grid.

DISCLOSURE

Technical Problem

An object of the present invention devised to solve the problem lies in an energy management apparatus capable of monitoring the energy operation state of a system in various manners.

Technical Solution

An energy management apparatus according to an embodiment of the present invention can display a three-dimensional energy graph indicating an energy operation state by respectively mapping an X-axis, a Y-axis and a Z-axis to a time, an energy device and an energy analysis object.

An energy management apparatus according to an embodiment of the present invention can easily change the display method of the energy graph such that any one of a three-dimensional energy graph, an XY-axis graph, an XZ-axis graph and a YZ-axis graph is displayed.

An energy management apparatus according to an embodiment of the present invention can change the display direction of the displayed graph through a drag-and-drop command. More specifically, the energy management apparatus can rotate the three-dimensional energy graph or change the XY-axis graph, the XZ-axis graph or the YZ-axis graph to a three-dimensional energy graph through the drag-and-drop command.

Advantageous Effects

According to various embodiments of the present invention, a user can intuitively confirm an energy operation state, by three-dimensionally displaying the power state information of an energy device.

According to various embodiments of the present invention, the user can easily analyze the energy operation state and reducing a time required for analysis, by displaying the energy operation state in various forms of graphs and easily changing the form of the graph.

According to various embodiments of the present invention, the user can freely and concentratively search for and analyze in detail a portion necessary for energy analysis, by analyzing the display direction of the graph.

BEST MODE

The following merely illustrates the principles of the present invention. Therefore, those skilled in the art are able to devise various apparatuses which embody the principles of the invention and are included in the concept and scope of the invention although not explicitly described or shown herein. Furthermore, all of the conditional terms and embodiments listed herein are, in principle, only intended for the purpose of enabling understanding of the concepts of the present invention, and are not to be construed as being limited to such specifically listed embodiments and states.

It should be understood that not only the principles, aspects and embodiments of the invention but also the detailed description of specific embodiments thereof are intended to cover structural and functional equivalents thereof. It should be understood that such equivalents include equivalents to be developed in the future as well as equivalents currently known in the art, that is, all elements invented to perform the same functions irrespective of structure.

In the claims of this specification, components represented as means for performing the functions described in the detailed description are intended to encompass all methods for performing all types of software including firmware/microcode or a combination of circuit elements for performing the functions and are coupled with an appropriate circuit for executing the software in order to perform the functions. It should be understood that, since the invention defined by the appended claims has the functions provided by the various listed means in the manner required by the claims, any means capable of providing such functions is equivalent to that understood from this specification.

The above-described objects, features and advantages of the invention will be more readily apparent from consideration of the following detailed description relating to the accompanying drawings. Therefore, a person skilled in the art will readily understand the technical idea of the present invention. In the description of the drawings, the related art which renders the scope of the present invention unnecessarily ambiguous will be omitted and procedures or steps which can be understood by those skilled in the art will be omitted.

The suffixes "module" and "unit" for components used in the description below are assigned or mixed in consideration of easiness in writing the specification and do not have distinctive meanings or roles by themselves.

Hereinafter, an energy management apparatus and a method of operating the same according to various embodiments of the present invention will be described in detail with reference to the accompanying drawings.

Figure 1:
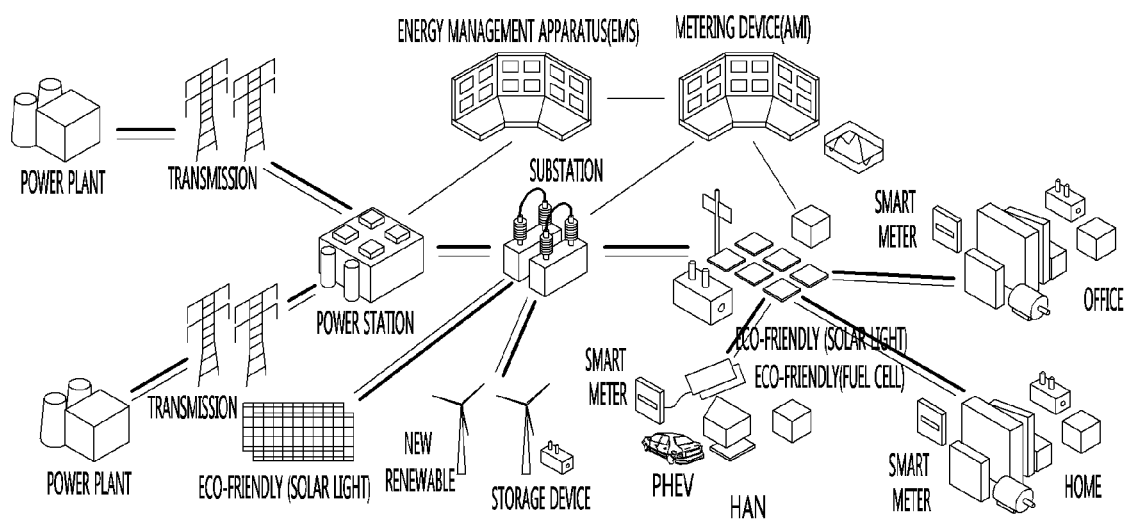
FIG. 1 is a diagram schematically showing a smart grid according to the present invention.

First, FIG. 1 is a diagram schematically showing a smart grid according to the present invention.

A smart grid is a next-generation power system capable of optimizing energy efficiency by bidirectionally exchanging real-time information between a power supplier and a consumer by combining an existing power system with information technology (IT).

The smart grid may manage an energy source such as electricity, water, gas, etc. The amount of generated or used energy source may be metered.

Accordingly, energy sources which are not described above may be included in a management object of this system. Hereinafter, electricity will be described as an energy source and the description of this specification is equally applicable to the other energy sources.

Referring to FIG. 1, the smart grid according to an embodiment includes a power plant for generating electricity. The power plant may include a power plant for generating electricity through thermal power generation or nuclear power generation and a power plant using water power, solar light or wind power as eco-friendly energy.

Electricity generated in the power plant is transmitted to a power station through a transmission line. The power station transmits electricity to a substation such that electricity is distributed to places of use such as home or offices.

In addition, electricity generated by eco-friendly energy is transmitted to a substation to be distributed to places of use. In addition, electricity transmitted by the substation is distributed to home or offices through an electricity storage device or directly.

Even in the home using a home area network (HAN), electricity is generated, stored or distributed through solar light or a fuel cell mounted in a plugin hybrid electric vehicle (PHEV) and remaining electricity may be sold to the outside (e.g., an electric power company).

In addition, the smart grid may include a smart meter for monitoring the amount of electricity used in the place of use (home or office) in real time and a metering device (an advanced metering infrastructure (AMI)) for measuring the amount of electricity used in a plurality of places of use. That is, the AMI may receive information measured by a plurality of smart meters to measure the amount of used electricity.

In this specification, metering includes metering of the smart meter and the AMI and receiving the amount of generated electricity or used electricity from another component and recognizing the amount of generated electricity or used electricity by the smart meter and the AMI.

In addition, the smart grid may further include an energy management system (EMS) for managing energy. The energy management system may generate information on operation of one or more components in association with energy (energy generation, distribution, use, storage, etc.) In addition, the energy management system may generate a command for operating at least one component. An energy management apparatus may be an energy control device configuring the energy management system.

In this specification, a function or solution performed by the energy management apparatus may be referred to as an energy management function or an energy management solution.

In the embodiment of the present invention, one or more energy management apparatuses may be provided in the smart grid as a separate configuration or may be included in one or more components as an energy management function or solution.

Figure 2:
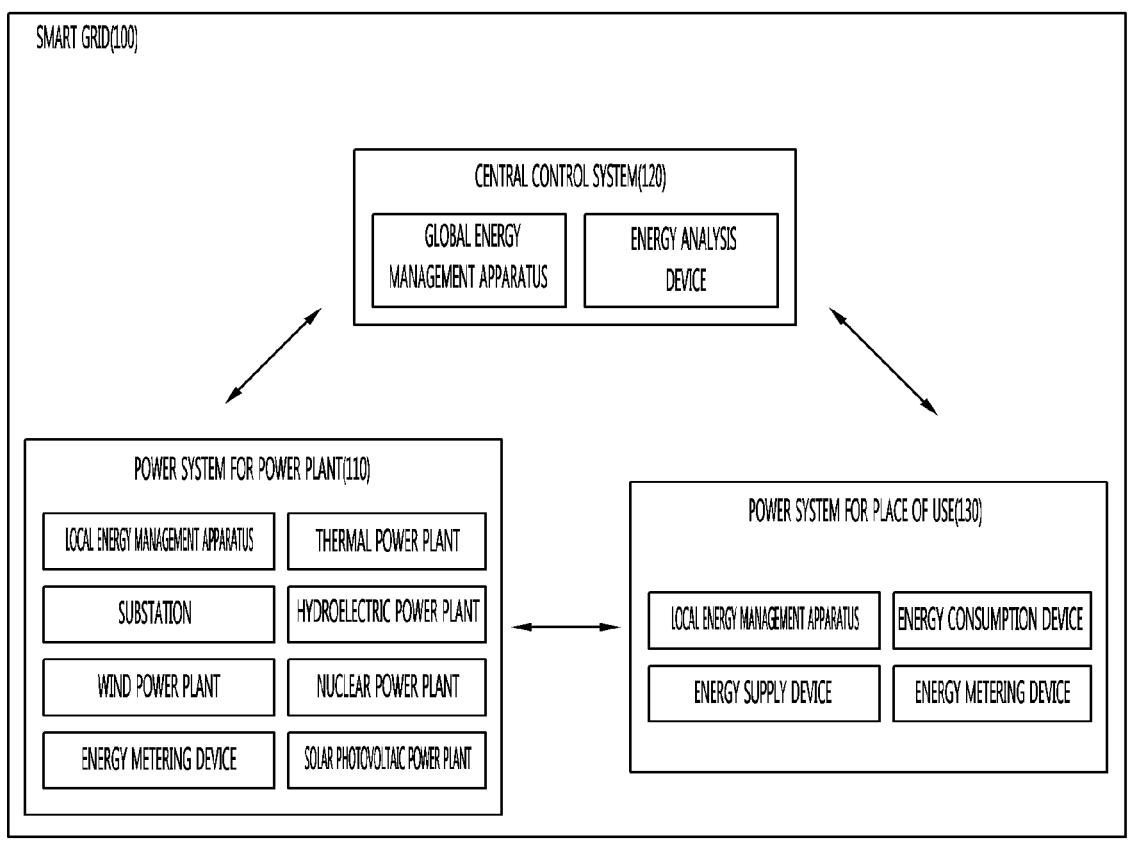
FIG. 2 is a block diagram schematically showing a smart grid according to the present invention.

FIG. 2 is a block diagram schematically showing a smart grid according to the present invention.

Referring to FIGS. 1 and 2, the smart grid 100 of the present invention includes a plurality of components. For example, a power plant, a substation, a power station, an energy management apparatus, a home appliance, a smart meter, a capacitor, a web server, a metering device, a home server, etc. may be provided as components of the smart grid. The energy management apparatus includes a local energy management apparatus and a global energy management apparatus. That is, the name of the energy management apparatus is changed according to a system to which the energy management apparatus belongs, and is not limited thereto.

In addition, in the present invention, each component may include a plurality of sub-components. For example, if one component is a home appliance, a microcomputer, a heater, a display, a motor, etc. may be included as the sub-components.

That is, in the present invention, all components for performing specific functions may be used. In addition, such components configure the smart grid of the present invention. In addition, two components may communicate with each other by a communication unit.

The smart grid 100 according to an embodiment of the present invention may include at least one power system for the power plant 110, a central control system 120 and a power system for a place of use 130.

The power system for the power plant 110 may share power information (energy information) of power plants, and the power system for the place of use 130 may share power information of electric mechanisms in the home or power information of electric mechanisms in an office. A local area system means the power system for the power plant 110 or the power system for the place of use 130.

The central control system 120 may control power information of the local area system. The global area system may mean the central control system 120. The global area system includes at least two local area systems and may be understood as the relative concept corresponding to the local area system.

The power system for the power plant 110 may include a power plant for generating power through thermal power generation, hydroelectric power generation or nuclear power generation and a solar photovoltaic power plant or a wind power plant using solar light or wind power as new renewable energy. Here, a unit configuring the power system for the power plant 110 such as a thermoelectric power plant or a hydroelectric power plant may be called a "power generation component".

Power generated by the thermal power plant, a hydroelectric power plant or a nuclear power plant is transmitted to the substation through a transmission line. The substation converts a voltage or current and distributes power to a place of use in a power system for the home/office. In addition, power generated by new renewable energy may be distributed into places of use through a substation.

The central control system 120 serves to control power supply, power consumption, power distribution and managements of a local area system in the smart grid 110, and includes a global energy management apparatus and an energy analysis (metering) device.

The global energy management apparatus serves to control local area systems. For example, the global energy management apparatus receives energy related information from the local energy management apparatus in a power network 110 for the power plant and the local energy management apparatus in the power system for the place of use 130 to enable overall energy management of the smart grid 100.

In addition, the smart grid 100 may include an energy management system (EMS). The energy management system means a system for controlling an energy management apparatus using an energy management program.

The energy management system may predict the power of each place of use in real time through communication between energy management apparatuses. The energy management system may be provided in each place of use or supplier and may be further provided in a local area system or global area system. The energy management system may be included in the energy management apparatus.

Examples of the energy management apparatus may include an automatic temperature control device, a cable set-top box, an intelligent display device, an automatic light control device, etc. Alternatively, the energy management apparatus may be provided in the form of a portable terminal to transmit and receive wireless signals to and from at least one of a base station, an external terminal and a server over a mobile communication network. Examples of the portable terminal may include a mobile phone, a smartphone, a laptop, a digital broadcast terminal, a personal digital assistant (PDA), a portable multimedia player (PMP), a navigation system, a wearable device, etc. In addition, short-range communication technology is applied to the portable terminal and Bluetooth, radio frequency identification (RFID), infrared data association (IrDA), ultrawideband (UWB), ZigBee, etc. may be used as the short-range communication technology.

The smart grid 100 may include an energy metering system. The energy metering system measures the amount of used energy from metering devices and collects and analyzes energy usage information. Examples of the metering device include electricity meters, gas meters or water meters. The energy metering device may be one component configuring the energy metering system.

The energy management apparatus and the energy metering device allow a consumer to efficiently use electricity and provide a power supplier with an ability to detect a system problem and efficiently operate the system.

For example, the real-time price signal of the electricity market is relayed through the energy management apparatus installed in each home and the energy management apparatus communicates with each electric apparatus to perform control. Therefore, a user recognizes power information of each electric apparatus through the energy management apparatus and performs power information processing such as power consumption or electric rate limit setting based on the recognized power information, thereby conserving energy and cost.

The power system 130 the place of use 130 may generate and consume electricity even in the home through solar light or a fuel cell mounted in a plugin hybrid electric vehicle (PHEV) and supply or sell remaining electricity to another local area system. In addition, in each local area system, the energy metering device is provided to grasp power and electric rates of the place of use in real time and the power supply unit in the local area system may recognize the amount of currently used power and the electric rates to seek for a method of reducing power consumption or electric rates according to the situation. In addition, bidirectional communication between local area systems or the units of the local area system is possible and bidirectional communication between a unit in any one local area system and a unit (component) in the other local area system is also possible. Here, the unit may include a power plant, an electricity company, a distributed power source, an energy management system, an energy metering system, an energy management apparatus or an electric apparatus. For example, bidirectional communication between the power system for the power plant 110 and the power system for the place of use 130 is possible, and electric apparatuses in the power system for the place of use 130 is also possible. Alternatively, bidirectional communication between a power plant in the power system for the power plant 110 and the energy management apparatus of the power system for the place of use 130 is also possible. Accordingly, adaptive electricity generation and distribution are possible, by monitoring the power consumption status of each place of use.

Figure 3:
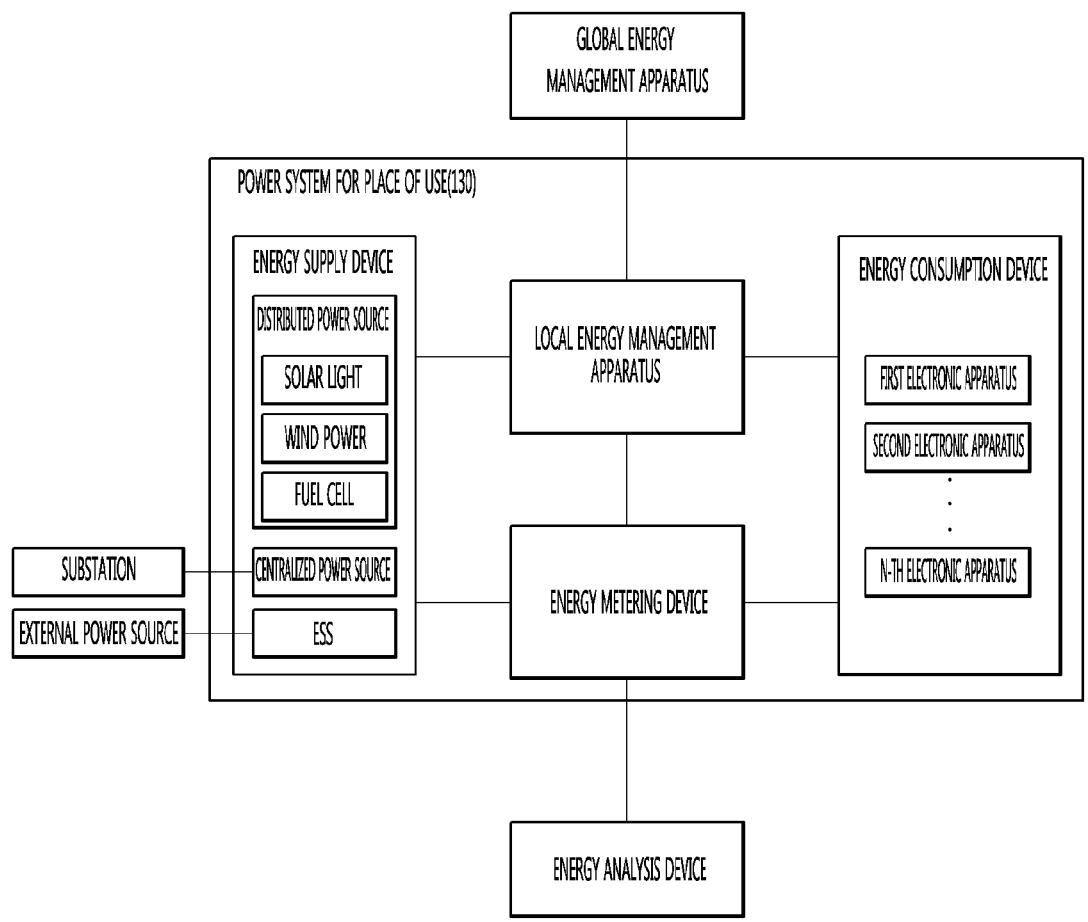
FIG. 3 is a block diagram schematically showing a power system for a place of use according to an embodiment of the present invention.

Next, FIG. 3 is a block diagram schematically showing a power system for a place of use according to an embodiment of the present invention.

The power system for the place of use 130 may correspond to one local area system of the smart grid 100. The power system for the place of use 130 may perform bidirectional communication with another local area system in the smart grid 100 and autonomously perform energy supply, consumption, storage, metering, management and communication.

The power system for the place of use 130 may roughly include an energy supply device, an energy consumption device, a local energy management apparatus and an energy metering device.

The power system for the place of use 130 may receive information on general management of the units in the power system for the place of use 130 through a public channel. For example, information which may be received through the public channel may include a unit identifier, current rate information, relative level information (e.g., high, medium, and low) of the current rate, usage information (e.g., residential or commercial), error confirmation information (e.g., CRC information), etc. In addition, a broadcast reception information for receiving the public channel may include DMB-T (Digital Multimedia Broadcasting-Terrestrial), DMB-S (Digital Multimedia Broadcasting-Satellite), MediaFLO (Media Forward Link Only), DVB-H (Digital Video Broadcast-Handheld), ISDB-T (Integrated Services Digital Broadcast-Terrestrial), etc.

Meanwhile, information acquired from the energy metering device may be transmitted to an external energy analysis device and information acquired from the local energy management apparatus may be transmitted to an external global energy management apparatus or another local energy management apparatus.

The energy supply device serves to supply power to all the units in the power system for the place of use 130 and may include a distributed power source, a centralized power source, and an energy storage device (Energy Storage System (ESS)).

The distributed power source means a source for supplying power other than power provided by an existing power plant, for example, power provided by another local area system or a self-power supply source (solar light, a wind power generation source, a fuel cell, etc.). The distributed power source may generate and store electricity through solar light and a PVEC and provide electricity to another local area system.

The centralized power source means an energy source for supplying power through large-scale power generation in a district heating corporation. Specifically, electricity generated in an external power plant is transmitted to a power station through a transmission line and the power station transmits electricity to a substation. The centralized power source may mean an energy source supplied through a substation. The centralized power source has high efficiency and has high initial investment.

The ESS serves to store energy received from an external power source and to distribute energy into the units in the power system for the place of use 130 if necessary.

The energy consumption device consumes energy received from the energy supply device based on a command received from the local energy management apparatus, and may include electric devices such as a home appliance, an automatic temperature control device, a cable set-top box, an automatic light control device. Examples of the energy consumption device may include home appliances (a refrigerator, a washing machine, an air conditioner, a cooker, a cleaner, a dryer, a dishwasher, a dehumidifier, a display device, a lighting device, etc.) or a heater, a motor, a display, etc. configuring the home appliance. In the present embodiment, the type of the energy consumption device is not limited.

The local energy management apparatus serves to monitor and control all the devices configuring the power system for the place of use 130. Each of the components configuring the local energy management apparatus will be described below with reference to FIG. 4.

The energy metering device is connected to the energy supply device or the energy consumption device to measure the amount of used energy and to collect and analyze energy usage information and may include electricity meters, gas meters or water meters. The information acquired from the energy metering device may be transmitted to the energy metering system. Information transmitted to the energy metering system may be transmitted to the energy analysis device in the central control system 120.

All the units of the power system for the place of use 130 may mutually perform bidirectional communication and may be controlled by the energy management apparatus.

Hereinafter, the components of the energy management apparatus according to the embodiment of the present invention will be described. The energy management apparatus means a global energy management apparatus for controlling the energy of the smart grid 100 or an energy management apparatus for controlling the energy of a local energy system.

Figure 4:
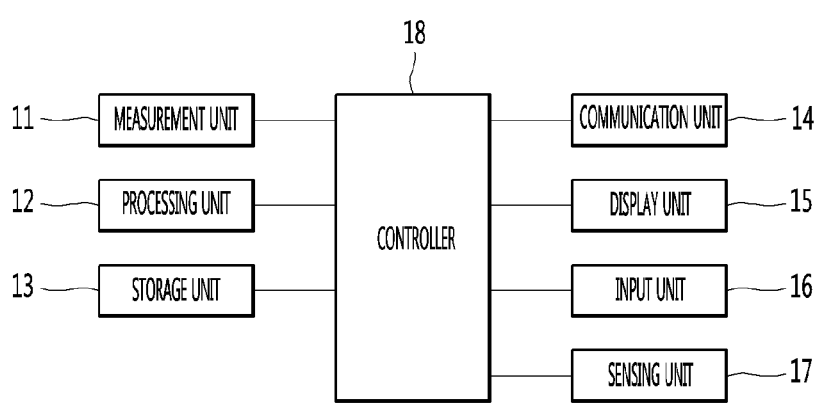
FIG. 4 is a block diagram showing the components of an energy management apparatus according to an embodiment of the present invention.

FIG. 4 is a block diagram showing the components of an energy management apparatus according to an embodiment of the present invention.

Referring to FIG. 4, the energy management apparatus 10 according to the embodiment of the present invention may include a measurement unit 11, a processing unit 12, a storage unit 13, a communication unit 14, a display unit 15, an input unit 16, a sensing unit 17, and a controller 18.

The measurement unit 11 measures and monitors the power state information of each device. The power state information of the device means information indicating the power state of the device configuring the smart grid 100. Here, the unit may include a power plant, an electric company, a distributed power source, an energy management system, an energy metering system or an electric apparatus. Examples of the power state information may include instantaneous power consumption, cumulative power consumption, cumulative power generation, per-cycle power consumption, per-cycle power generation, or allowable power amount.

In addition, the measurement unit 11 may monitor a current energy state (e.g., energy consumption per hour or a current rate state), the current state of the device (e.g., active, standby, or under maintenance), an operation mode state (e.g., charging or in use), a power quality state (e.g., frequency, neural voltage, harmonic state), an environmental condition (e.g., temperature, humidity, motion, wind, light intensity) and environmental impact (e.g., $CO_2$ emission). Power state information measured by the measurement unit 11 may be output to the processing unit 12 or the controller 18 or may be transmitted to another energy management apparatus 10 through the communication unit 14.

The processing unit 12 calculates energy consumption information using the power state information received from the measurement unit 11. The energy consumption information means information necessary to manage energy consumption of the user. Examples of the energy consumption information include energy cost of cumulative energy consumption, energy cost of instantaneous power consumption, energy cost per hour, energy cost for rate tiers/energy blocks, energy cost for time-of-use energy rates, cost for critical peak pricing, cost for capacity billing rates, cost due to billing factors (for example, taxes, rental rates or discount), cost according to user-defined parameters, cost according to history per cycle, the amount of power generated/consumed according to history per cycle, or environmental impact information (e.g., $CO_2$ emission or predicted $CO_2$ emission). The calculated energy consumption information may be displayed through the display unit 15 or transmitted to another energy management apparatus via the communication unit 14.

The storage unit 13 stores the power state information of each device measured through the measurement unit 11 or energy consumption information calculated through the processing unit 12. The storage unit 13 may update the stored information at predetermined cycles. Specifically, the storage unit 13 may delete energy consumption information stored for a predetermined period or more and receive and store new energy consumption information at predetermined cycles. For example, the predetermined period in which the energy consumption information is stored may be three months and the cycle at which new energy consumption information is received may be one day. However, this is merely an example, and the present invention is not limited thereto.

The communication unit 14 may be wired or wireless and may transmit information output from the measurement unit 11, the processing unit 12 and the controller 18 to another energy management apparatus 10 or transmit information received from another energy management apparatus 10 to the measurement unit 11, the processing unit 12, the storage unit 13 and the controller 18. The communication unit 14 may be a simple communication line or a power line communication means. The power line communication means may include a communication device (e.g., a modem, etc.) connected to two components. In another example, the communication unit 14 may be ZigBee, Wi-Fi, Bluetooth, etc.

The display unit 15 displays information necessary for energy management. Specifically, the display unit 15 may display the operation state of each device or reset information capable of setting initialization of each device. For example, the display unit 15 may provide alarm information (e.g., an alarm indicating limit price information and an event message) and display detailed information of each device (e.g., device type, model name, default setting, and battery lifespan).

In addition, the display unit 15 may display power state information of the device measured by the measurement unit 11, energy consumption information calculated by the processing unit 12 or information received by the communication unit 14. The display unit 15 may display energy related information transmitted through the controller 18. In addition, the display unit 15 may display a user command received through the input unit 16.

The input unit 16 may receive a user command necessary for energy management. For example, the input unit 16 may receive a user command for controlling the energy supply device or the energy consumption device. In another example, the input unit 16 may receive a command for inputting various types of setting information necessary to control the energy management apparatus 10.

The input unit 16 may transmit user input information to the measurement unit 11, the processing unit 12 or the controller 18.

The sensing unit 17 may sense a control signal of at least one energy device configuring the system. The energy device means a device for generating or consuming energy. For example, if the energy management apparatus 10 is included in the power system for the place of use 130, the energy device includes an energy supply device (solar photovoltaic power generator, a wind power generator, a fuel cell, a centralized power source and an ESS) and an energy consumption device (an electronic apparatus). The sensing unit 17 may sense a control signal of such an energy device. The control signal may include a power on/off signal, an operation mode setting signal, etc.

The controller 18 controls overall operation necessary for operation of the energy management apparatus 10. The controller 18 may control operation of another component configuring the energy management apparatus 10.

The controller 18 controls the energy management apparatus 10 based on an input signal. For example, the controller 18 may control on/off of an electric load or may control on/off of an electric load according to time interval settings. The controller 18 may perform more accurate control according to user settings within a predetermined threshold. In addition, the controller 18 may restrict the operation mode according to a threshold, a set value or a price point. For example, upon reaching a certain price point during operation of a standard mode, the standard mode may be restricted and converted into an conservation mode. The controller 18 outputs a control command optimal for efficient power consumption based on input information received from the input unit 16.

In addition, the controller 18 may control an energy device in the system. For example, the controller 18 may turn the energy device in the system on or off or control the operation mode of the energy device.

In addition, the controller 18 may perform control to display an energy operation state on the display unit 15 using the power state information of each energy device acquired through the measurement unit 11.

The energy operation state may include energy generation information, energy consumption information and energy efficiency information of the energy device in the system.

Figure 5:
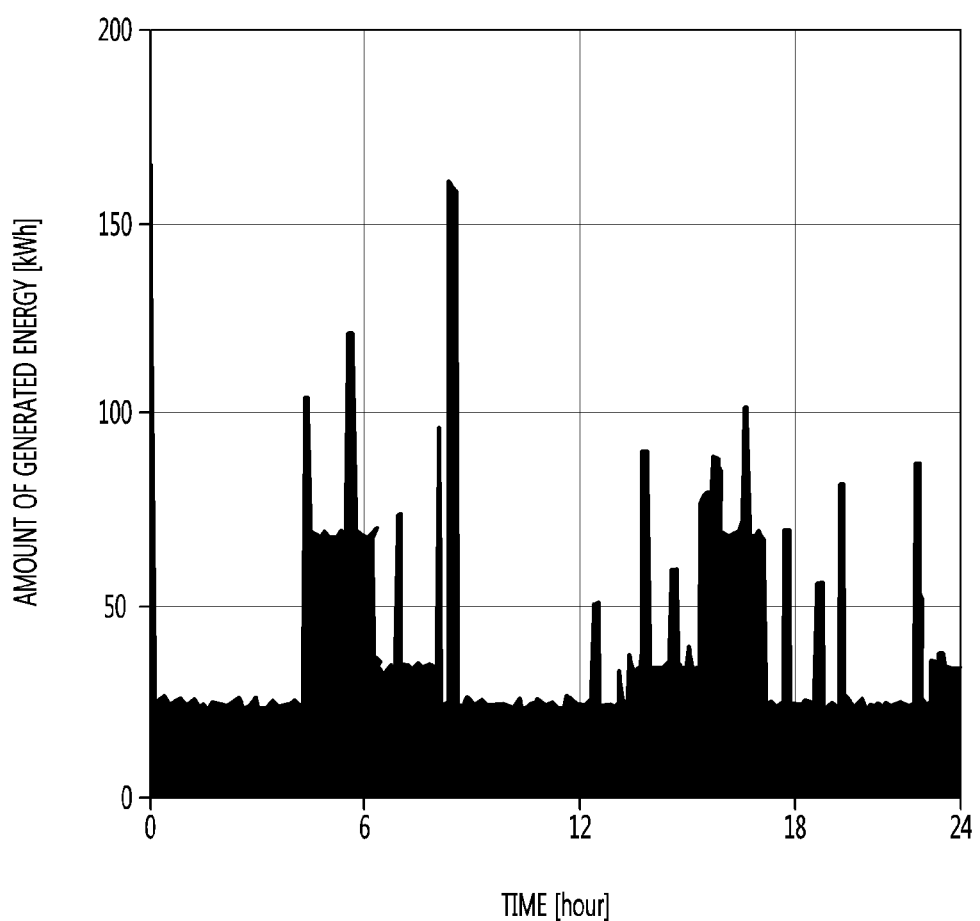
FIG. 5 is a diagram showing a method of displaying a conventional energy operation state.

FIG. 5 is a diagram showing a method of displaying a conventional energy operation state. Specifically, the graph shown in FIG. 5 shows the amount of energy generated by an arbitrary energy supply device in the system with time.

FIG. 5 shows the energy operation state of the conventional energy management apparatus in a planar graph. Accordingly, since only the energy operation state of one energy management apparatus is displayed on one screen, the energy operation states of energy devices need to be separately confirmed. In addition, it is difficult to analyze the energy operation state while comparing several energy management apparatuses.

In addition, even if the energy operation states of a plurality of energy management apparatuses are displayed on one screen, several data overlap on the plane. Therefore, it is easy to analyze the energy operation states.

Next, a method of displaying an energy operation state at an energy management apparatus 10 according to the embodiment of the present invention will be described with reference to FIGS. 6 to 20.

Figure 6:
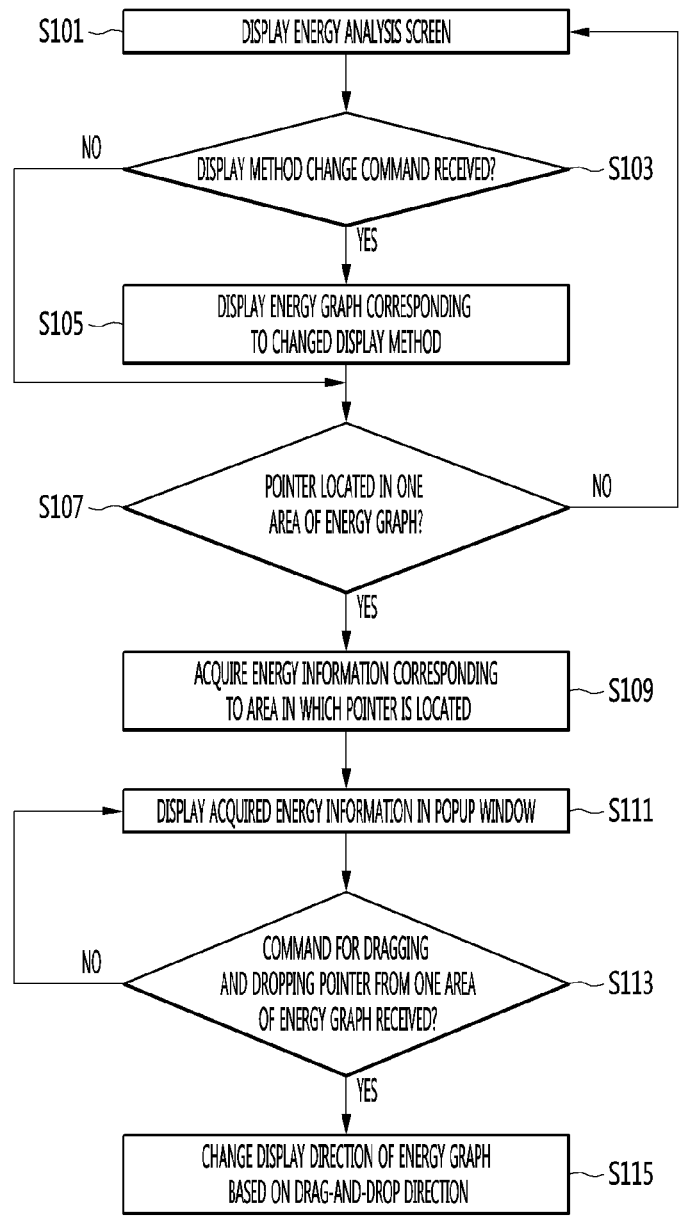
FIG. 6 is a flowchart illustrating a method of displaying an energy operation state at an energy management apparatus according to an embodiment of the present invention.

First, FIG. 6 is a flowchart illustrating a method of displaying an energy operation state at an energy management apparatus according to an embodiment of the present invention.

The display unit 15 may display an energy analysis screen (S101).

The controller 18 may acquire the power state information of the energy device in the system through the measurement unit 11. Alternatively, the controller 18 may receive the power state information of the energy device in the system from an energy metering device through the communication unit 14.

The controller 18 may analyze the energy operation state through the power state information of the energy device in the system. Specifically, the controller 18 may analyze the amount of generated energy, the amount of consumed energy and energy efficiency of the energy device in the system.

The controller 18 may control the display unit 15 to display the energy analysis screen based on the analyzed energy operation state.

Figure 7:
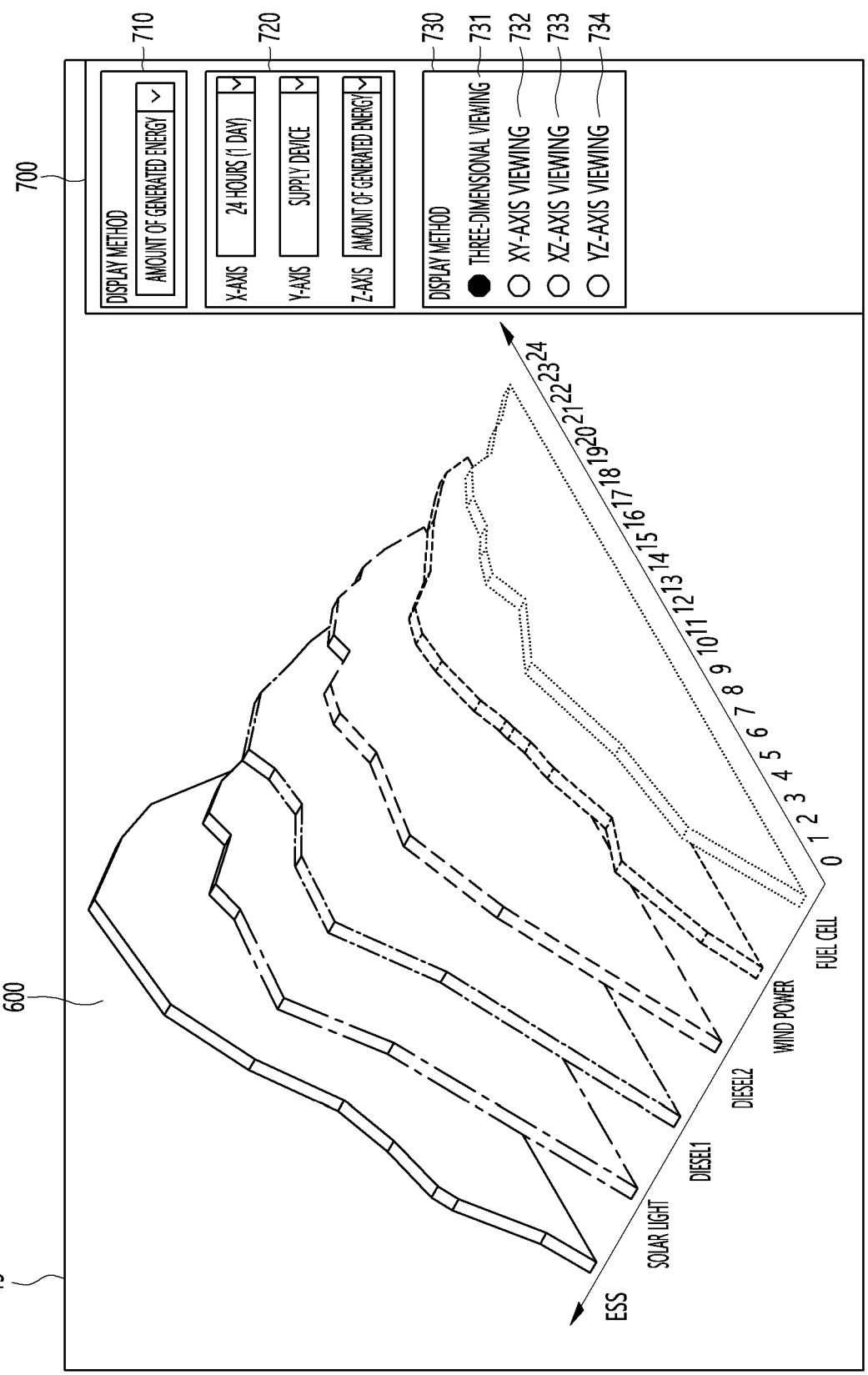
FIG. 7 is a diagram illustrating a method of displaying an energy analysis screen at an energy management apparatus according to an embodiment of the present invention.

Next, FIG. 7 is a diagram illustrating a method of displaying an energy analysis screen at an energy management apparatus according to an embodiment of the present invention.

The input unit 16 may receive an energy analysis screen display command. When the energy analysis screen display command is received, the controller 18 may analyze the energy operation state and display the energy analysis screen shown in FIG. 7.

Referring to FIG. 7, the energy analysis screen may include an energy graph 600 and an energy analysis menu 700. The energy analysis menu 700 may include an analysis type menu 710, a per-axis option menu 720 and a display method menu 730.

The analysis type menu 710 refers to a menu for selecting an energy analysis object to be displayed in the energy graph 600. The analysis type menu 710 may include the amount of generated energy, the amount of consumed energy and energy generation efficiency. However, this is an example and the analysis type menu 710 may further include energy related information of a group including at least one unit such as refrigeration performance index of each outdoor unit and dimming of each lighting.

The controller 18 may receive a command for selecting the energy analysis object through the analysis type menu 710 and display the energy graph 600 corresponding to the received command.

The per-axis option menu 720 refers to a menu for setting first to third axes configuring the energy graph 600. The first to third axes may be an X-axis, a Y-axis and a Z-axis.

The first to third axes may be respectively mapped to a time, an energy device and an energy analysis object.

The time indicates a time unit of display of the energy graph 600. The controller 18 may receive a command for selecting any one of one hour, one day, one week, one month and one year and display the energy graph 600 based on the selected unit.

The energy analysis object may mean energy data displayed in the energy graph 600. The energy analysis object may include at least one of the amount of generated energy, the amount of consumed energy, energy generation efficiency, a refrigeration performance index of each outdoor unit or dimming of each lighting.

When the command for selecting the energy analysis object is received, the controller 18 may acquire and display energy data related to the selected energy analysis object in the energy graph 600.

The energy device may mean an energy supply device or an energy consumption device corresponding to the energy data displayed in the energy graph 600. That is, the energy device may vary according to the energy analysis object.

For example, the energy device may be an energy supply device when the energy analysis object is the amount of generated energy or energy generation efficiency, may be an energy consumption device when the energy analysis object is the amount of consumed energy, may be an outdoor unit of a building when the energy analysis object is a refrigeration performance index of each outdoor unit, and may be a lighting of a building when the energy analysis object is dimming of each lighting.

In the present invention, the energy management apparatus 10 may provide the per-axis option menu 720, such that a user freely analyzes the energy operation state.

Meanwhile, when the energy analysis object is selected through the analysis type menu 710, the controller 18 may perform control such that the energy analysis object axis of the per-axis option menu 720 and the energy device axis are automatically selected. Alternatively, the controller 18 may perform control such that the selected item of the analysis type menu 710 is changed according to change in the energy analysis object axis or the energy device axis.

The display method menu 730 may include a three-dimensional viewing item 731, an XY-axis viewing item 732, an XZ-axis viewing item 733 and a YZ-axis viewing item 734.

When a command for selecting any one item in the display method menu 730 is received, the controller 18 may change the display method to an energy graph corresponding to the selected item.

The display method of the energy graph will be described below with reference to FIGS. 8 to 11.

FIG. 6 will be described again.

The controller 18 may determine whether a display method change command is received (S103).

That is, the controller 18 may determine whether a command for changing the display method of the energy graph has been received through the display method menu 730.

When the display method changing command is received, the controller 18 may display the energy graph corresponding to the changed display method (S105).

Next, the display method of the energy graph will be described with reference to FIGS. 8 to 11.

Figure 8:
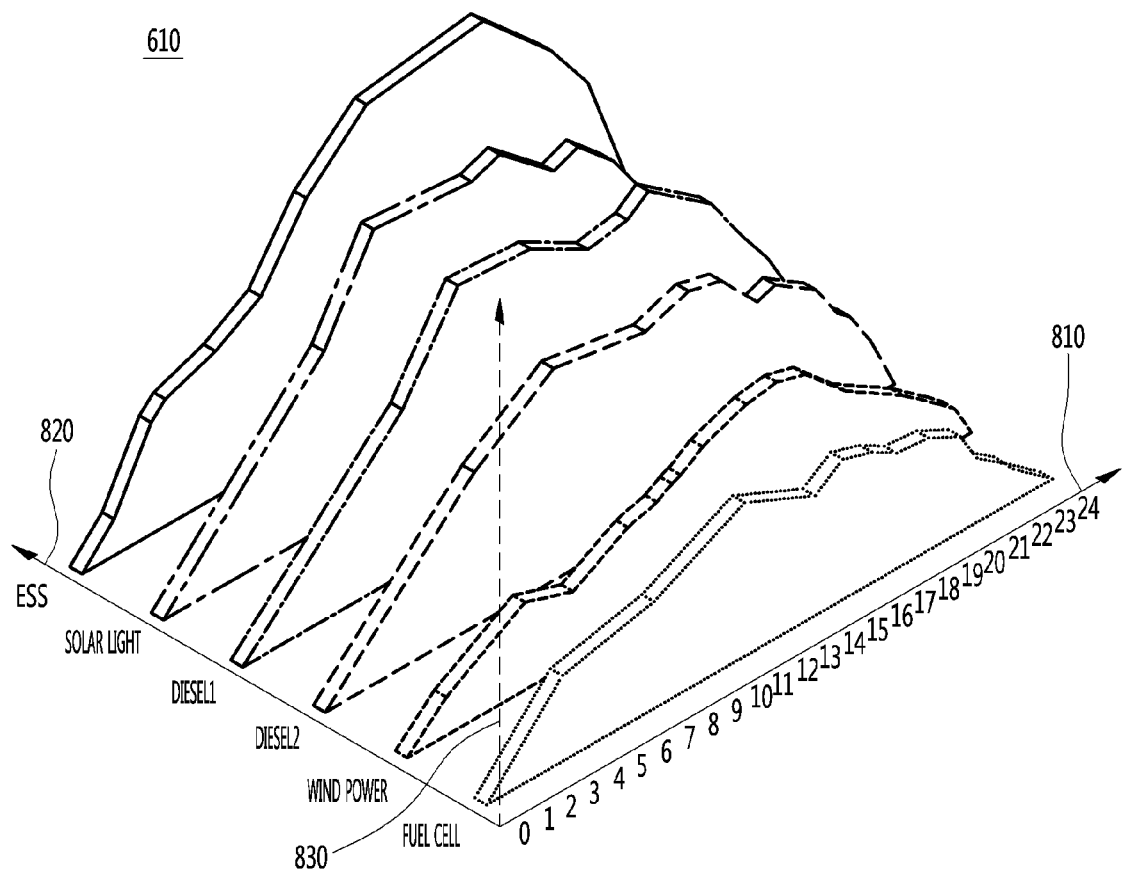
FIG. 8 is a diagram illustrating an energy graph according to a three-dimensional display method according to an embodiment of the present invention.

First, FIG. 8 is a diagram illustrating an energy graph according to a three-dimensional display method according to an embodiment of the present invention.

The controller 18 may display a three-dimensional energy graph 610 in which a first axis, a second axis and a third axis are respectively a time, an energy device and an energy analysis object. The first to third axes 810, 820 and 830 may be an X-axis, a Y-axis and a Z-axis.

Hereinafter, for example, the three-dimensional energy graph 610 in which the first axis 810 is an X-axis indicating a time, the second axis 820 is a Y-axis indicating an energy supply device, and the third axis 830 is a Z-axis indicating the amount of generated energy will be described. However, this is an example of the present invention and the present invention is not limited thereto.

Referring to the three-dimensional energy graph 610 shown in FIG. 8, the first axis 810, that is, the X-axis, indicates a time in units of one hour, the second axis 820, that is, the Y-axis, indicates the energy supply device, and the third axis 830, that is, the Z-axis, indicates the amount of generated energy. Therefore, the amount of generated energy of each energy supply device for one day can be displayed on one screen.

Meanwhile, the controller 18 may display the three-dimensional energy graph 610 in which the colors of the energy supply devices are different.

In addition, the controller 18 may change the chroma of the three-dimensional energy graph 610 according to the amount of generated energy. Specifically, the controller 18 may display the three-dimensional energy graph 610 such that the chroma increases in proportion to the amount of generated energy.

The energy management apparatus according to the present invention can intuitively display the energy operation state using the energy graph of the three-dimensional display method such that the user immediately grasps the energy operation state.

Figure 9:
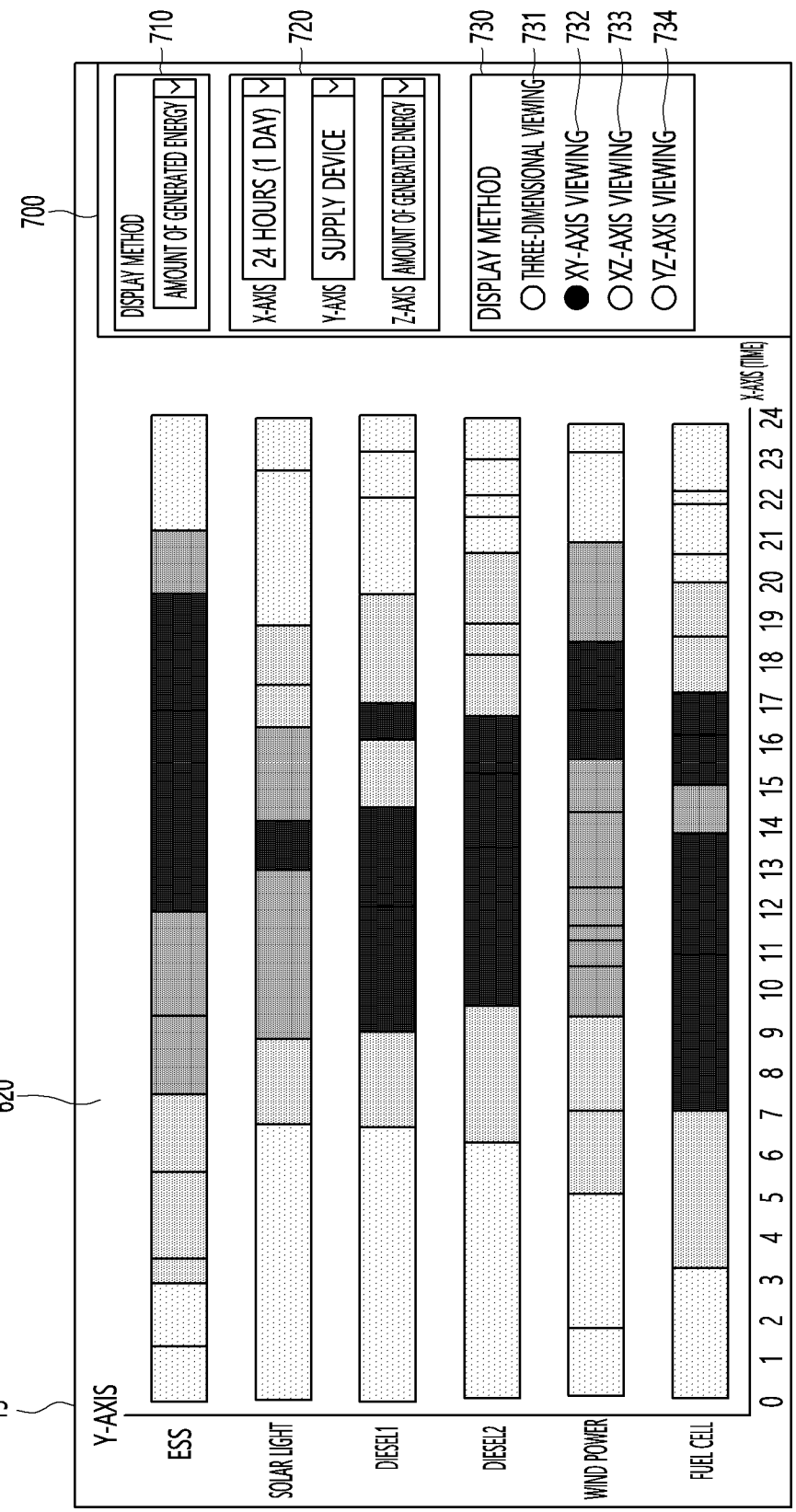
FIG. 9 is a diagram illustrating an energy graph according to an XY-axis viewing method according to an embodiment of the present invention.

Next, FIG. 9 is a diagram illustrating an energy graph according to an XY-axis viewing method according to an embodiment of the present invention.

When a command for selecting the XY-axis viewing item 732 in the display method menu 730 is received, the controller 18 may display a horizontal bar graph 620 as shown in FIG. 9.

The controller 18 may display the horizontal bar graph 620 according to the energy supply device.

When the horizontal bar graph 620 is displayed, the controller 18 may display data corresponding to the Z-axis with chroma in the three-dimensional display method. That is, one horizontal bar graph 620 may be divided into a plurality of areas and the divided areas have different chromas according to the data corresponding to the Z-axis.

For example, the controller 18 may display the amount of generated energy of each energy supply device with chroma varying with time. That is, the controller 18 may display the horizontal bar graph 620 such that the chroma increases as the amount of generated energy increases.

The horizontal bar graph 620 may be a top view of the energy graph 810 of the three-dimensional display method (in the Z-axis direction).

Meanwhile, even in this case, the controller 18 may display the energy graph in which the colors of the energy supply devices are different.

Figure 10:
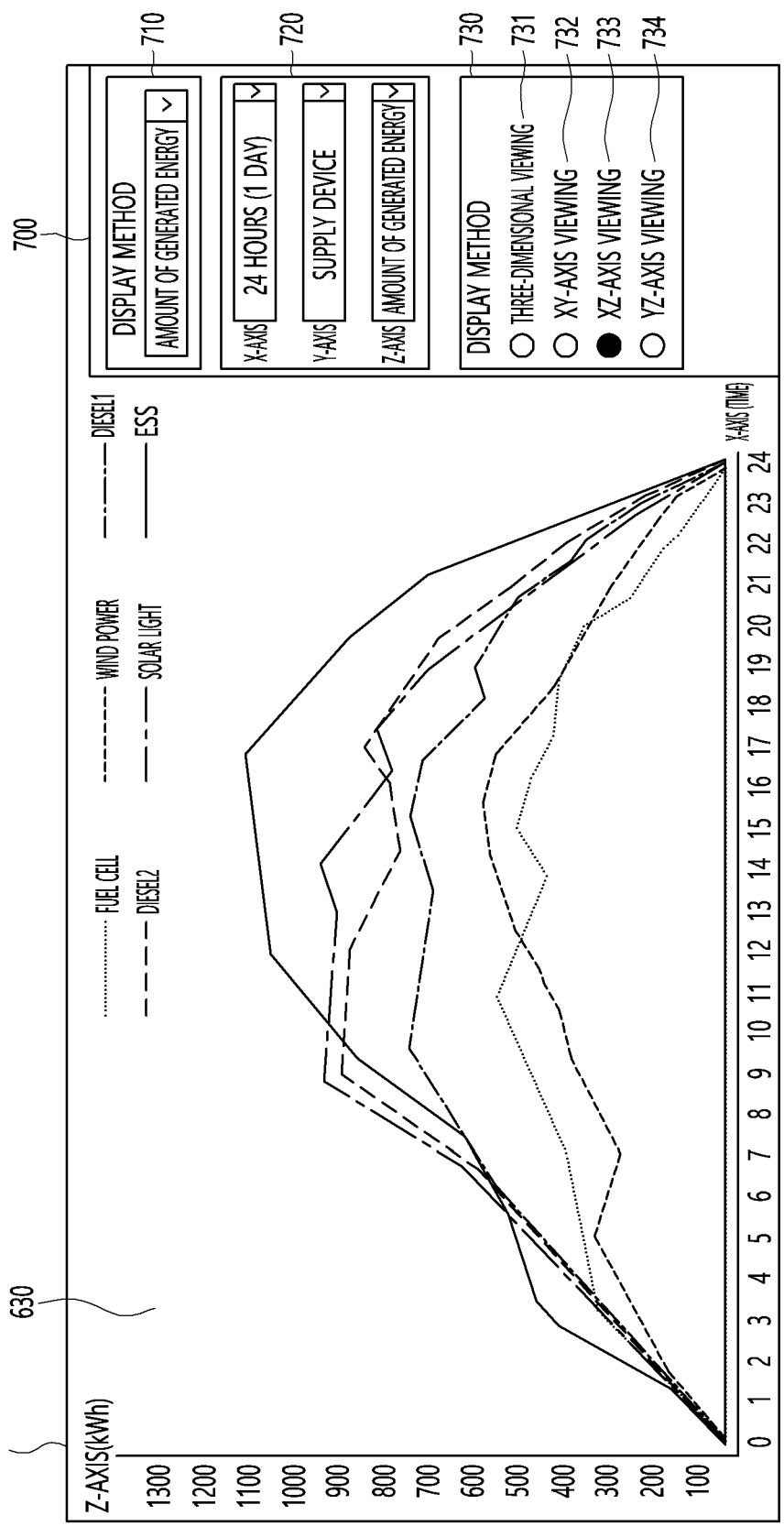
FIG. 10 is a diagram illustrating an energy graph according to an XZ-axis viewing method according to an embodiment of the present invention.

Next, FIG. 10 is a diagram illustrating an energy graph according to an XZ-axis viewing method according to an embodiment of the present invention.

When a command for selecting the XZ-axis viewing item 732 in the display method menu 730 is received, the controller 18 may display a graph of broken line 630 as shown in FIG. 10. Specifically, the controller 18 may display the graph of broken line 630 such that the energy supply devices corresponding to the Y-axis are distinguished in the graph of the three-dimensional display method.

For example, the controller 18 may display the energy supply devices with different colors or different line types in the graph of broken line 630.

The graph of broken line 630 may be a front view of the energy graph 810 of the three-dimensional display method of FIG. 8 (in the X-axis direction).

Figure 11:
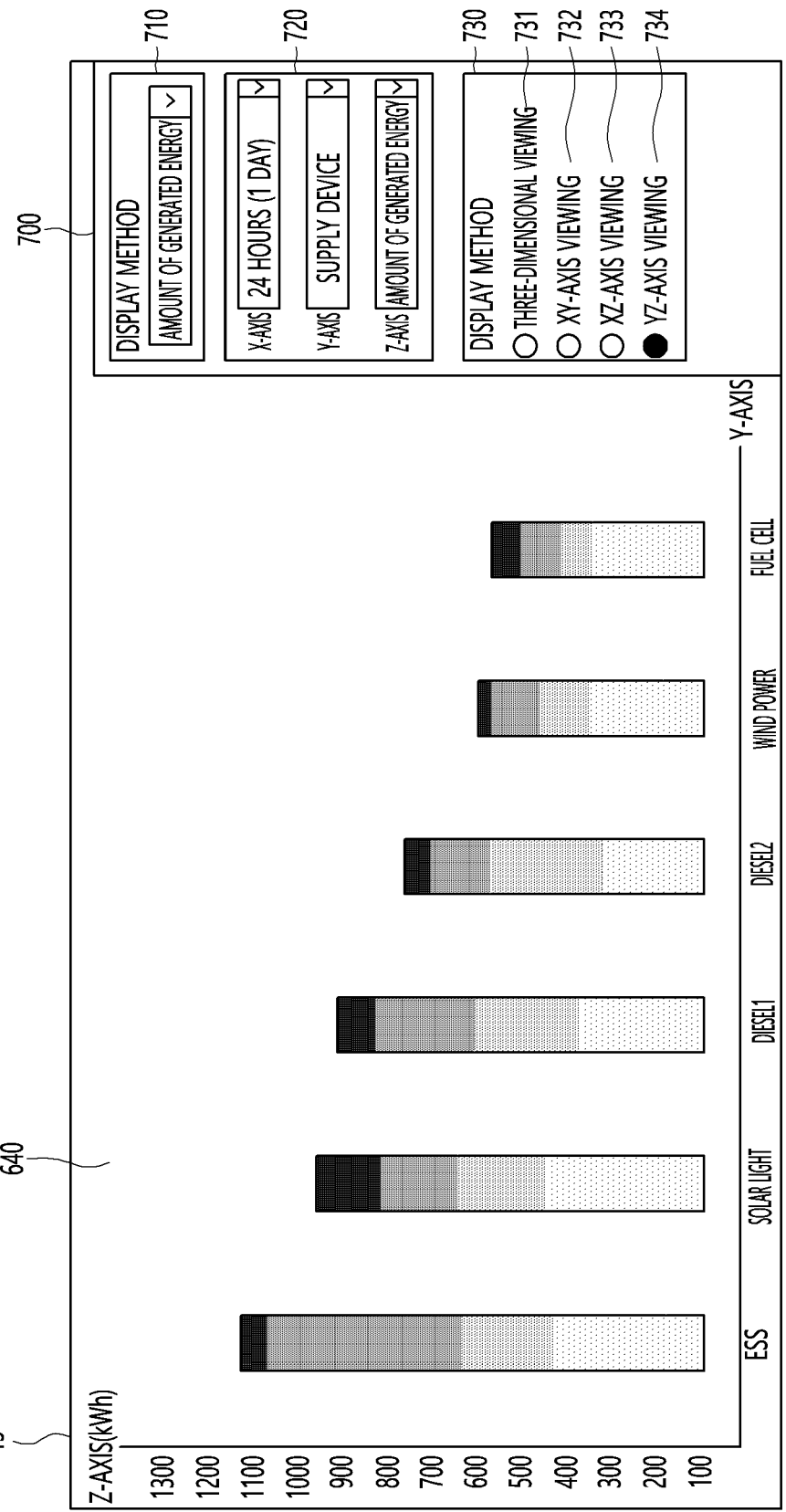
FIGS. 11 and 12 are diagrams illustrating an energy graph according to a YZ-axis viewing method according to an embodiment of the present invention.
Figure 12:
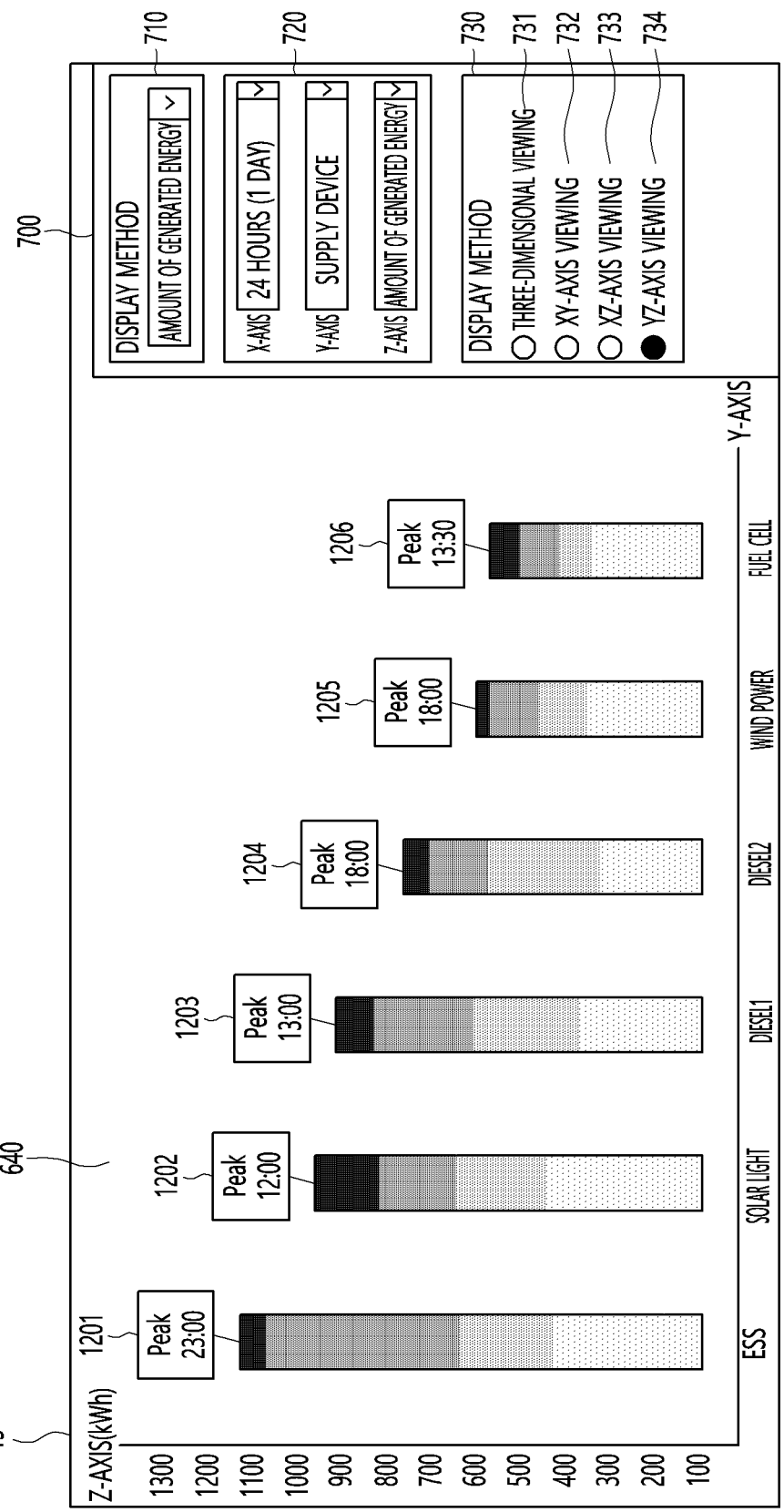

Next, FIGS. 11 and 12 are diagrams illustrating an energy graph according to a YZ-axis viewing method according to an embodiment of the present invention.

According to the embodiment of the present invention, when a command for selecting the YZ-axis viewing item 734 in the display method menu 730 is received, the controller 18 may display a vertical bar graph 640 as shown in FIG. 11. Specifically, the controller 18 may show a maximum amount of energy generated in each energy supply device in the vertical bar graph 640. That is, the vertical bar graph 640 may indicate the maximum value of the data corresponding to the Z-axis.

Accordingly, the user can immediately grasp the maximum amount of energy generated in each energy supply device.

Meanwhile, as shown in FIG. 12, according to another embodiment of the present invention, when the command for selecting the YZ-axis viewing item 734 is received, the controller 18 may further display peak time windows 1201 to 1206 along with the vertical bar graph 640.

The peak time windows 1201 to 1206 include information on a time when the amount of energy generated by each energy supply device is maximum. That is, the peak time windows 1201 to 1206 may include information on a time when the data corresponding to the Z-axis indicates a maximum value.

Therefore, the user can grasp the maximum amount of energy generated in each energy supply device and time information corresponding to the maximum amount of generated energy.

The vertical bar graph 640 may be a side view of the energy graph 810 of the three-dimensional display method of FIG. 8 (in the Y-axis direction).

The energy graph 600 displayed through the energy analysis screen was described with reference to FIGS. 8 to 11.

The energy management apparatus 10 according to the present invention may easily change the graph to one of the three-dimensional energy graph 610, the horizontal bar graph 620, the graph of broken line 630 and the vertical bar graph 640 through the display method menu 730. That is, the user may easily change one graph to another graph, thereby easily analyzing the energy operation state.

In particular, when the energy analysis screen is displayed, the controller 18 may provide the display method menu 730 capable of displaying the three-dimensional energy graph 610 as an initial energy graph and immediately changing the graph to a graph indicating a more detailed energy operation state, thereby providing a method of allowing the user to easily analyze the energy.

When the energy analysis screen is displayed, the controller 18 may display the energy graph of the three-dimensional display method as the initial energy graph.

Alternatively, the controller 18 may receive an initial energy graph setting command through the input unit 16 and initially display an energy graph corresponding to the set display method. Specifically, the controller 18 may receive a command for setting any one of the three-dimensional energy graph, the XY-axis graph, the XZ-axis graph and the YZ-axis graph as the initial energy graph. When the energy analysis screen is displayed, the controller 18 may display the initial energy graph according to the set display method.

The controller 18 may display the energy graph and detect whether a pointer is located in one area of the displayed energy graph (S107).

The pointer may move on the display unit 15 based on the signal received through the input unit 16. Alternatively, the display unit 15 may include a touchscreen such that the pointer moves through touch input.

The controller 18 may detect whether the pointer is located in one area of the graph displayed on the display unit 15. The graph displayed on the display unit 15 may be any one of the three-dimensional energy graph 610, the horizontal bar graph 620, the graph of broken line 640 and the vertical bar graph 640.

When the pointer is not detected in one area of the energy graph, the controller 18 may continuously display the energy analysis screen.

When the pointer is detected in one area of the energy graph, the controller 18 may acquire energy information corresponding to the area in which the pointer is located (S109).

Specifically, the controller 18 may acquire at least one of time information, energy device information or amount-of-energy information corresponding to the area in which the pointer is located from the graph.

The controller 18 may display the acquired energy information on a popup window (S111).

Specifically, the controller 18 may display the energy information corresponding to the pointer position in the popup window.

Next, FIGS. 13 to 16 are diagrams illustrating a method of displaying a popup window at an energy management apparatus according to an embodiment of the present invention.

Figure 13:
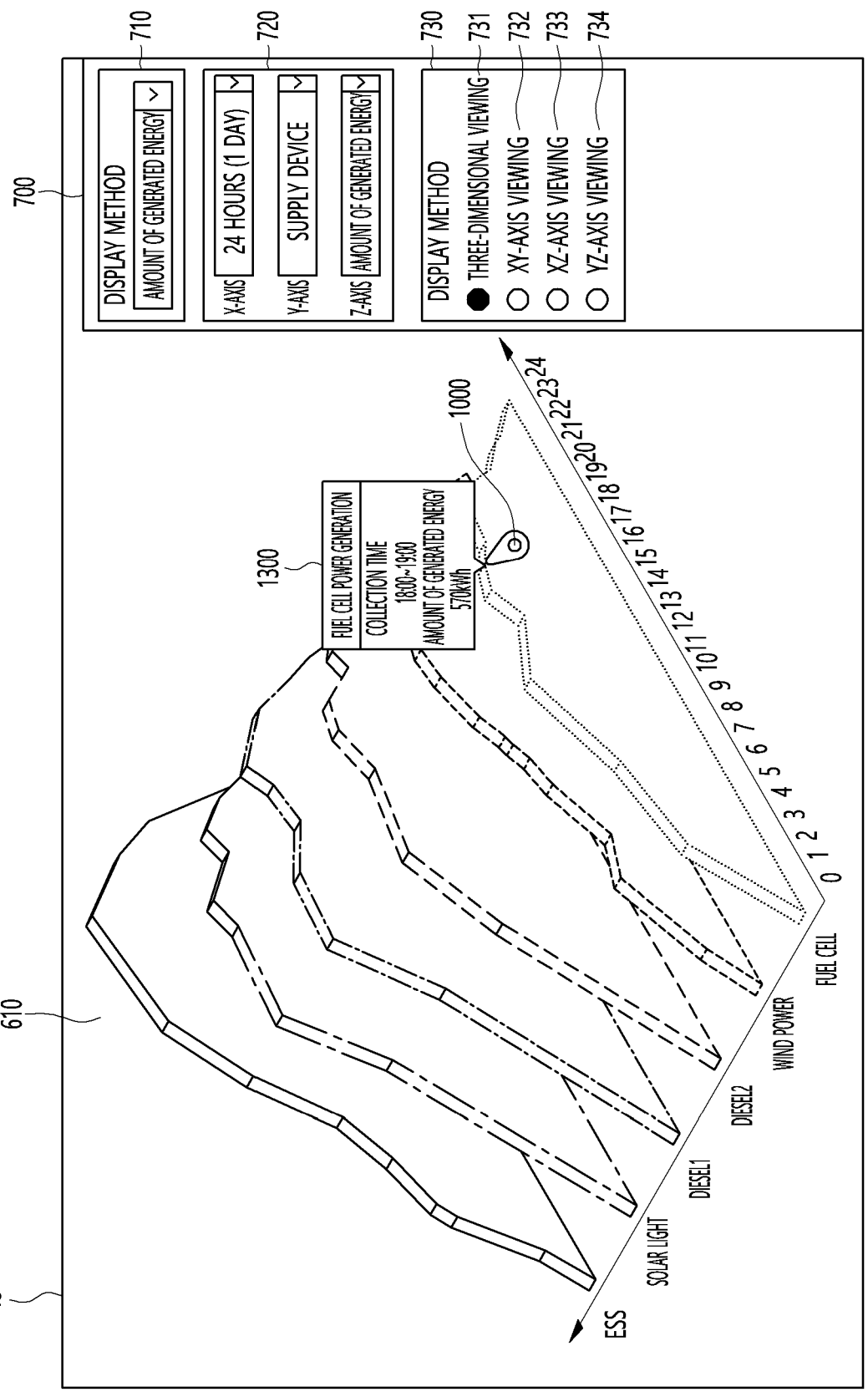
FIGS. 13 to 16 are diagrams illustrating a method of displaying a popup window at an energy management apparatus according to an embodiment of the present invention.

As shown in FIG. 13, the controller 18 may detect that the pointer 1000 is located in one area of the three-dimensional energy graph 610. For example, the controller 18 may detect that the pointer 1000 is located in an area corresponding to power generation of the fuel cell at 18:00 to 19:00 of the three-dimensional energy graph 610.

The controller 18 may acquire the energy information corresponding to the position of the pointer 1000 and display the energy information in the popup window 1300. The popup window 1300 may include information indicating that the amount of energy generated by the fuel cell at 18:00 to 19:00 is 570 kWh.

Figure 14:
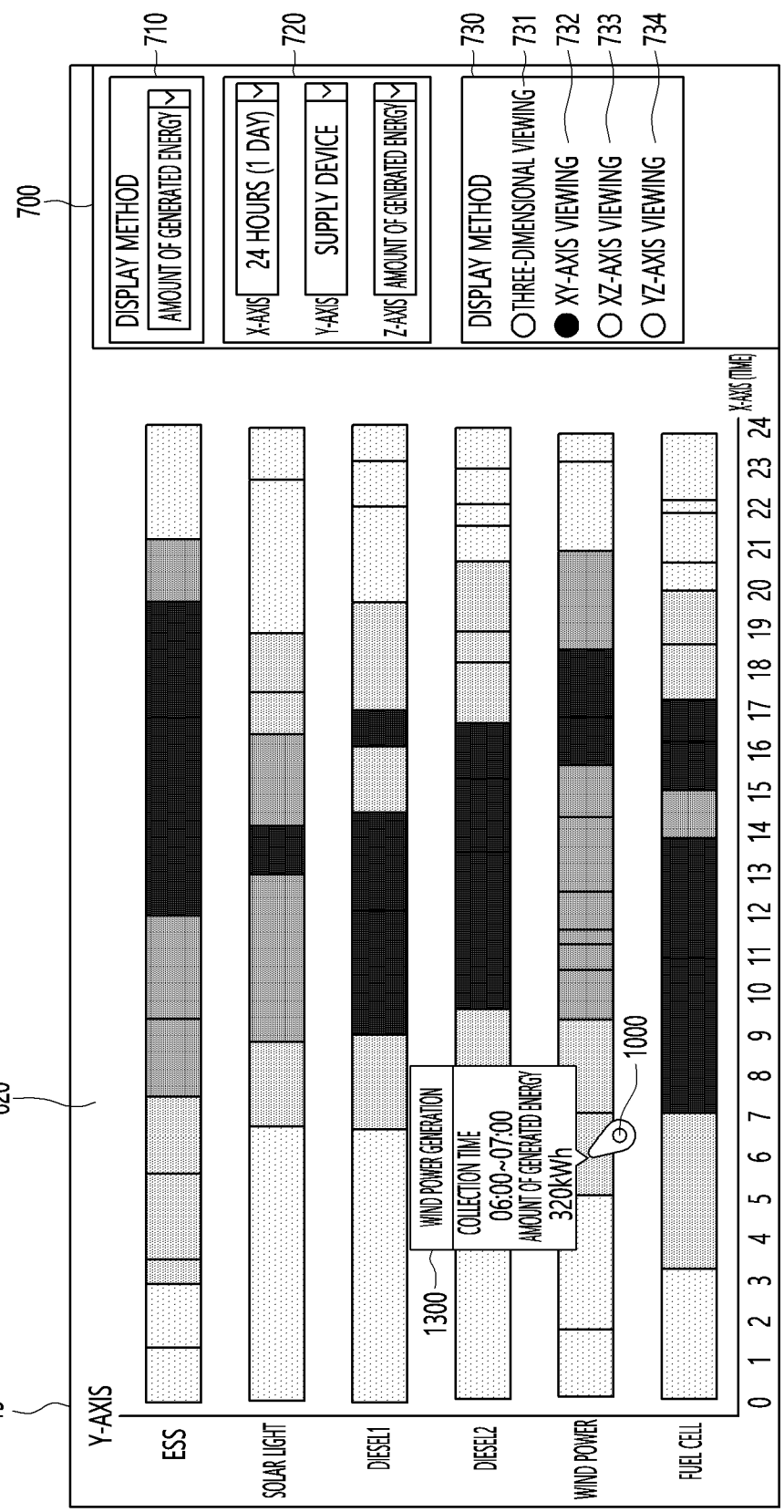

Alternatively, as shown in FIG. 14, the controller 18 may detect that the pointer 1000 is located in one area of the horizontal bar graph 620. For example, the controller 18 may detect that the pointer 1000 is located in an area corresponding to wind power generation at 06:00 to 07:00 of the horizontal bar graph 620.

The controller 18 may acquire the energy information corresponding to the position of the pointer 1000 and display the energy information in the popup window 1300. The popup window 1300 may include information indicating that the amount of energy generated by wind power at 06:00 to 07:00 is 320 kWh.

Figure 15:
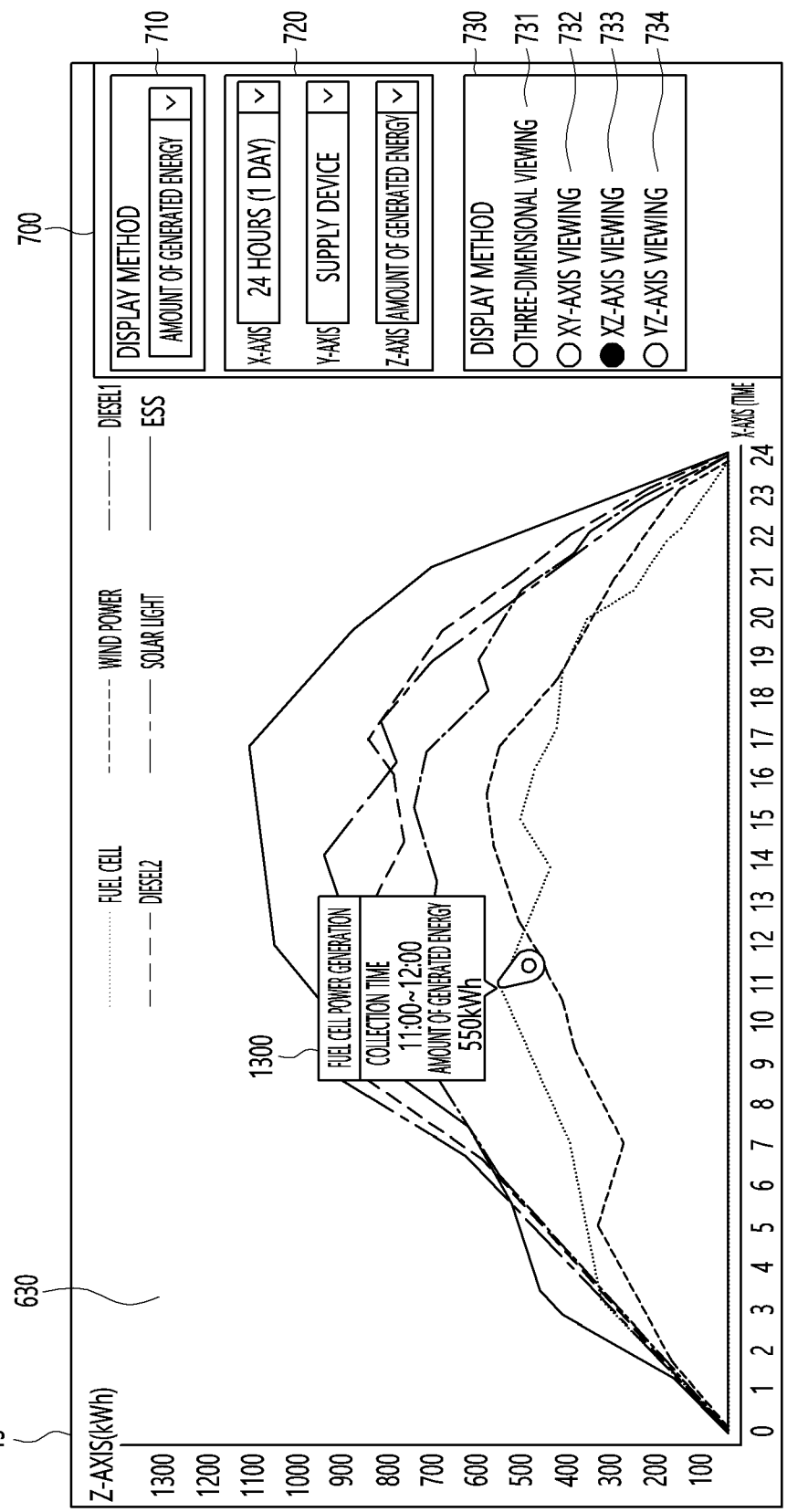

Alternatively, as shown in FIG. 15, the controller 18 may detect that the pointer 1000 is located in one area of the graph of broken line 630. For example, the controller 18 may detect that the pointer 1000 is located in an area corresponding to fuel cell power generation at 11:00 to 12:00 of the graph of broken line 630.

The controller 18 may acquire the energy information corresponding to the position of the pointer 1000 and display the energy information in the popup window 1300. The popup window 1300 may include information indicating that the amount of energy generated by fuel cell power generation at 11:00 to 12:00 is 550 kWh.

Figure 16:
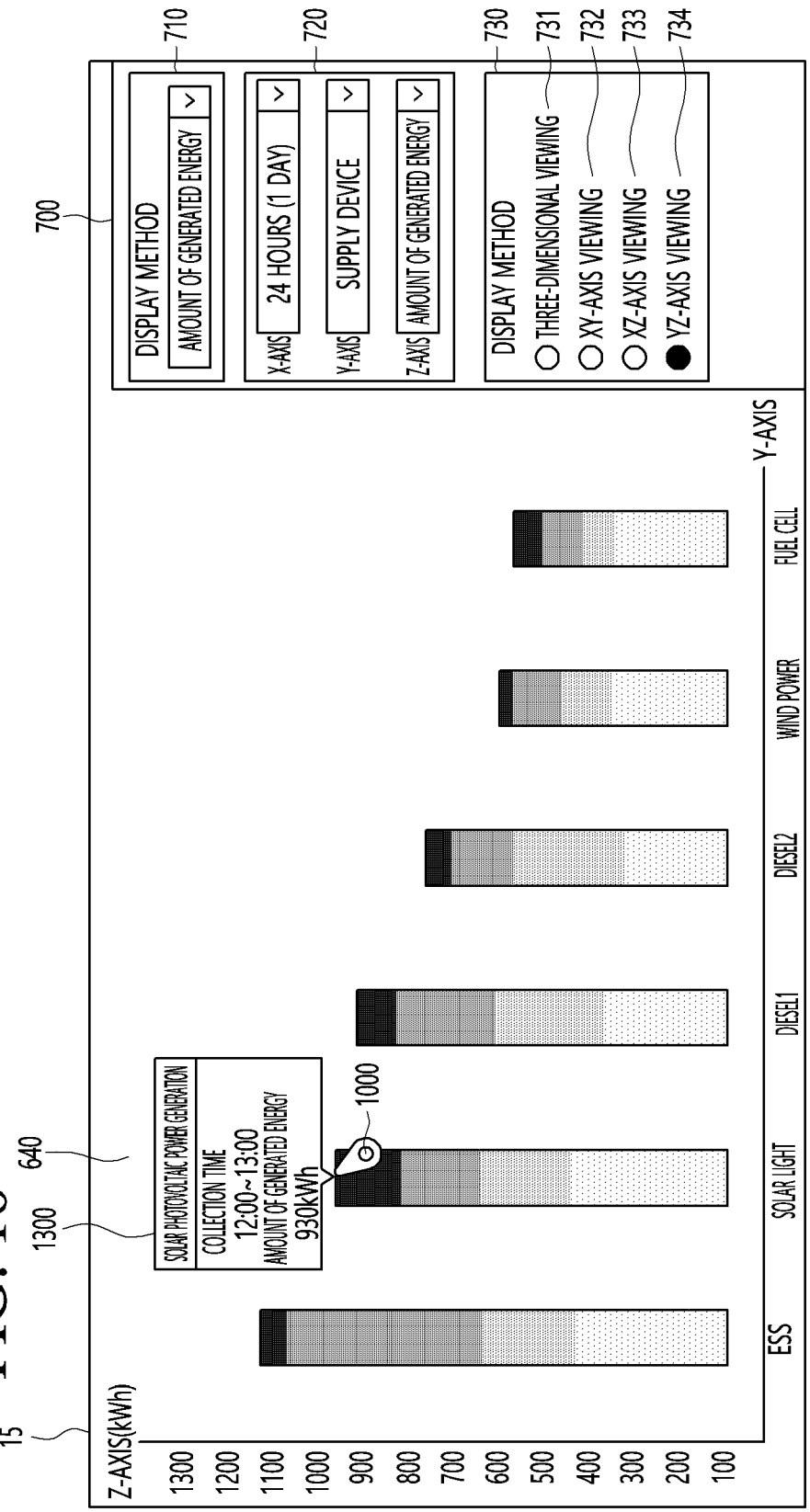

Alternatively, as shown in FIG. 16, the controller 18 may detect that the pointer 1000 is located in one area of the vertical bar graph 640. For example, the controller 18 may detect that the pointer 1000 is located in an area corresponding to solar photovoltaic power generation at 12:00 to 13:00 of the vertical bar graph 640.

The controller 18 may acquire the energy information corresponding to the position of the pointer 1000 and display the energy information in the popup window 1300. The popup window 1300 may include information indicating that the amount of energy generated by solar photovoltaic power generation at 12:00 to 13:00 is 930 kWh.

When the pointer 1000 is detected on the energy graph 600, the controller 18 may perform control to display the popup window 1300. However, this is an example, and, when a command for double-clicking an area of the energy graph 600 is received through the pointer 1000, the controller 18 may display the popup window 1300 and all commands for selecting specific areas of the energy graph 600 may be included.

FIG. 6 will be described again.

The controller 18 may detect whether a command for dragging and dropping the pointer is received in one area of the energy graph 600 (S113).

Specifically, the controller 18 may detect whether a command for selecting one area of the energy graph 600 using the pointer 1000 and dragging and dropping the pointer to another area is received.

When the drag-and-drop command is detected, the controller 18 may change the display direction of the energy graph based on a drag-and-drop command (S115).

The controller 18 may rotate and display the energy graph 600 by a drag distance in a drag direction.

According to one embodiment, the controller 18 may rotate the three-dimensional energy graph 610. Specifically, the controller 18 may rotate the three-dimensional energy graph 610 according to the drag-and-drop command to change the display direction.

Therefore, the user can freely rotate the three-dimensional energy graph 610 according to the analysis subject to analyze a necessary area in detail.

In addition, the controller 18 may rotate the three-dimensional energy graph 610 according to the drag direction and the drag distance and display the XY-axis graph (the horizontal bar graph 620), the XZ-axis graph (the graph of broken line 630) or the YZ-axis graph (the vertical bar graph 640).

That is, the controller 18 may immediately change the display method of the energy graph using a shortcut as described through steps S103 and S105 or may change the display method of the graph through the drag-and-drop command.

According to the method of changing the display method using the shortcut, the user may rapidly change the graph to a graph suiting the analysis subject, thereby shortening an analysis time. In contrast, according to the method of changing the display method using the drag-and-drop command, the user may find a portion necessary for energy analysis and perform more detailed analysis.

Similarly, the controller 18 may rotate the XY-axis graph (the horizontal bar graph 620), the XZ-axis graph (the graph of broken line 630) or the YZ-axis graph (the vertical bar graph 640) through the drag-and-drop command to change the graph to the three-dimensional energy graph 610.

Next, FIGS. 17A to 17C, FIGS. 18A to 18C, FIGS. 19A to 19C and FIGS. 20A to 20C are diagrams illustrating a method of changing the display direction of an energy graph at an energy management apparatus according to an embodiment of the present invention.

Figure 17A:
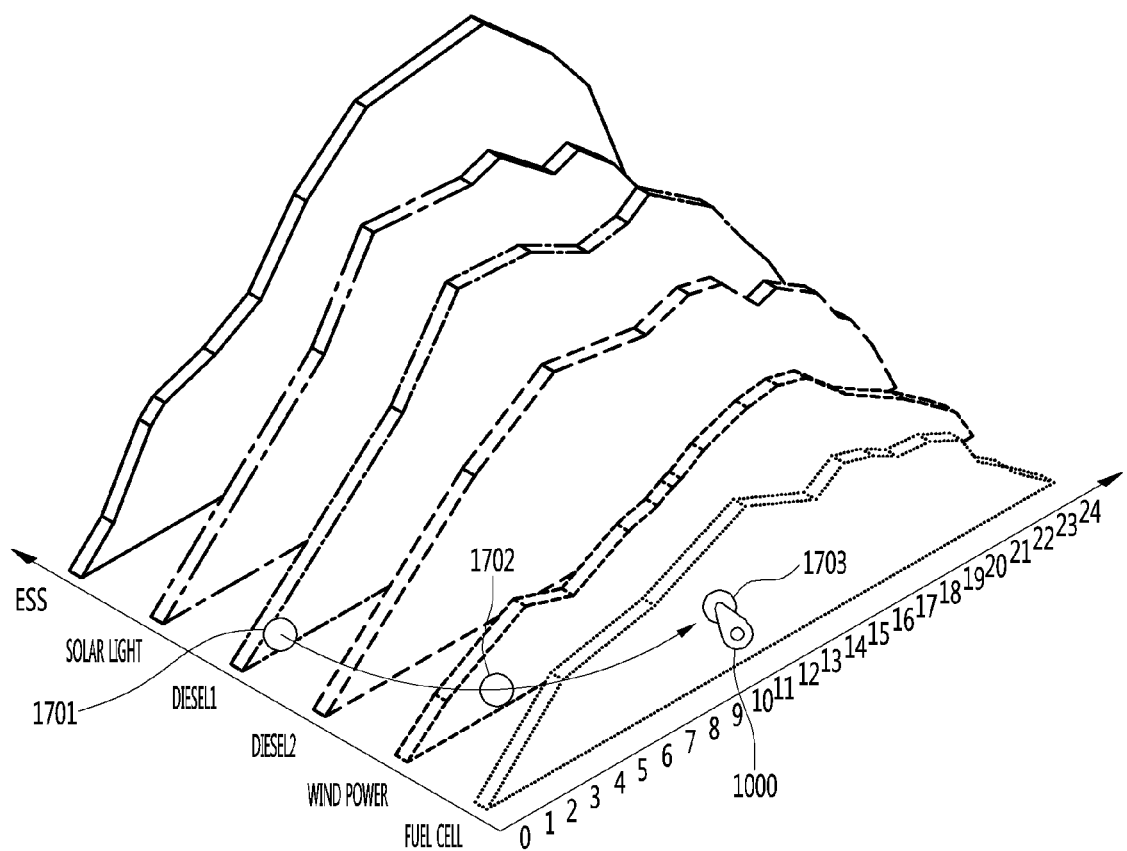
FIGS. 17A to 17C are diagrams illustrating a method of changing the display direction of an energy graph at an energy management apparatus according to an embodiment of the present invention.

Referring to FIG. 17A, the controller 18 may receive a command for selecting a first area 1701 of the three-dimensional energy graph using the pointer 1000 to drag and drop the pointer to a third area 1703. That is, the pointer 1000 may move from the first area 1801 to the third area 1703 through a second area 1702.

The controller 18 may rotate and display the three-dimensional energy graph while the pointer 1000 moves from the first area 1701 to the third area 1703 through the second area 1702.

Figure 17B:
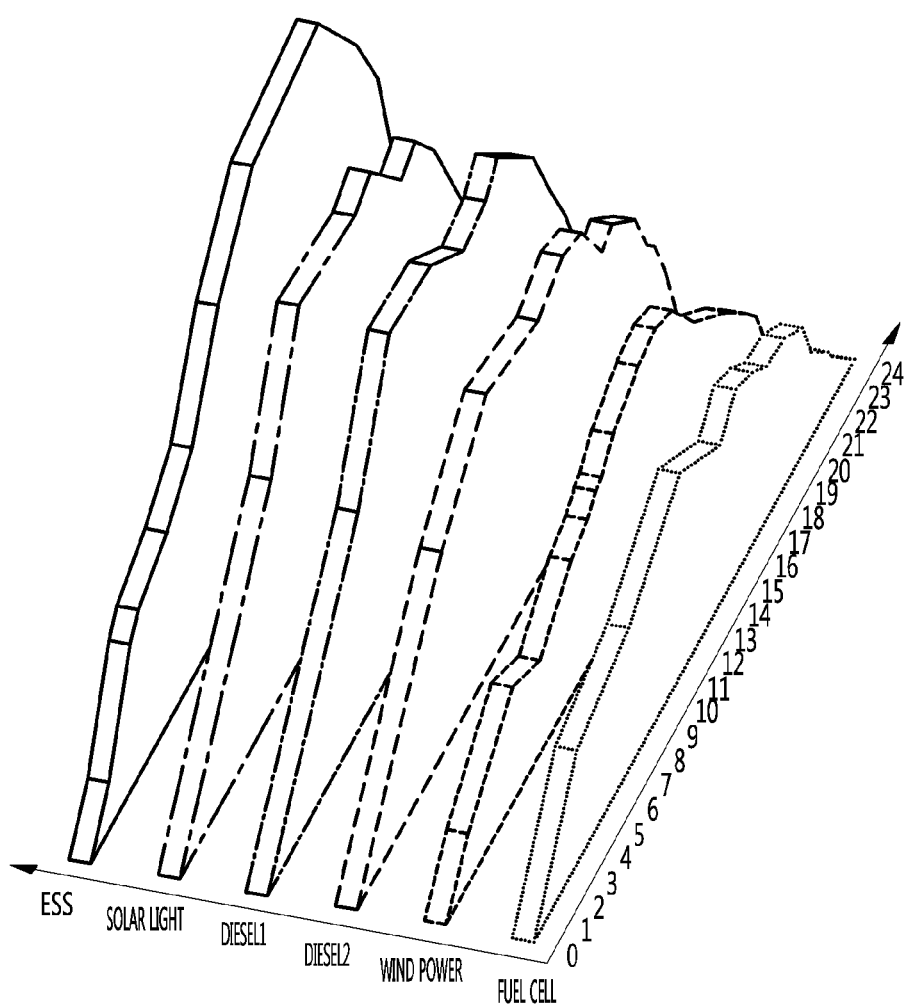
Figure 17C:
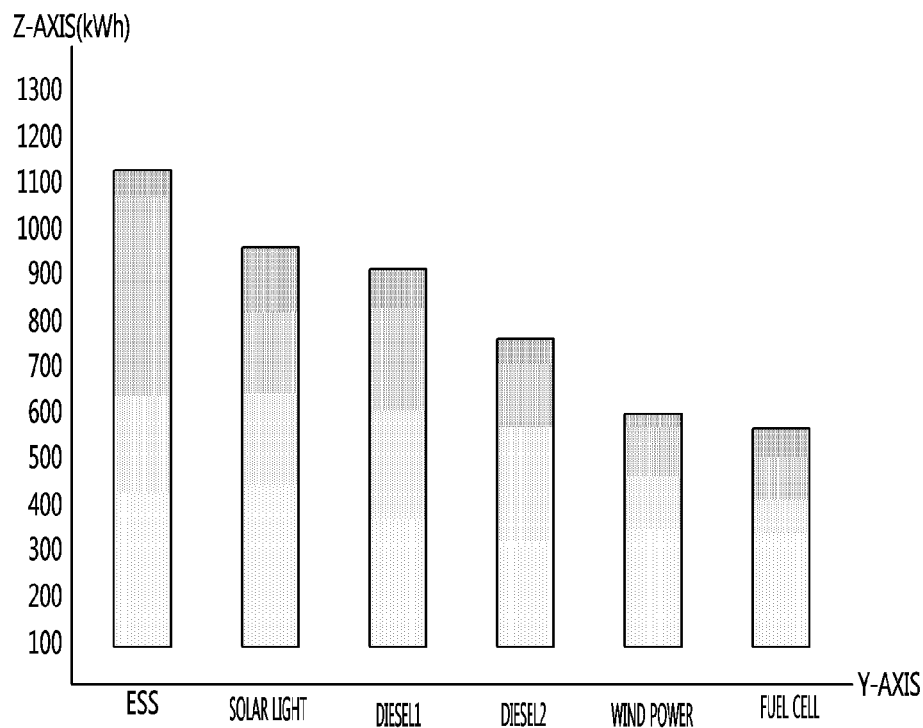

Specifically, the controller 18 may display the graph shown in FIG. 17B when the pointer 1000 is located in the second area 1702 by rotating the three-dimensional energy graph. Thereafter, the controller 18 may display the graph shown in FIG. 17C when the pointer 1000 is located in the third area 1703. The controller 17 may change the three-dimensional energy graph to the vertical bar graph according to the drag direction and the drag distance.

However, this is an example and the controller 18 may change the three-dimensional energy graph to the XY-axis graph (the horizontal bar graph) or the XZ-axis graph (the graph of broken line) according to the drag direction.

Figure 18A:
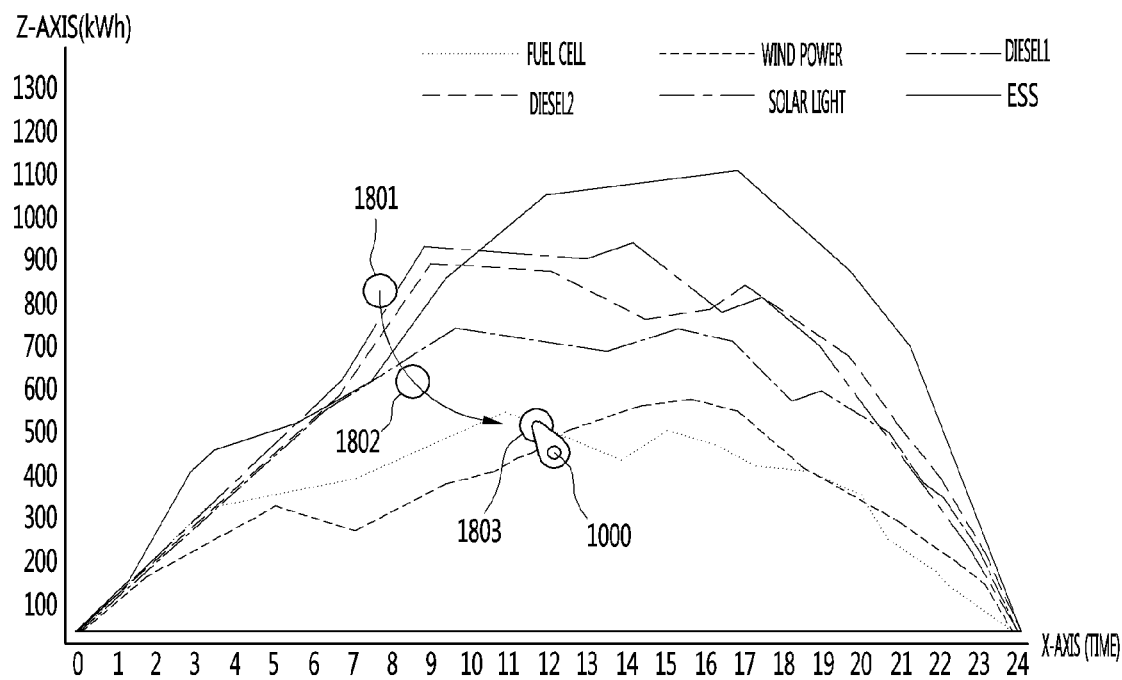
FIGS. 18A to 18C are diagrams illustrating a method of changing the display direction of an energy graph at an energy management apparatus according to an embodiment of the present invention.
Figure 18B:
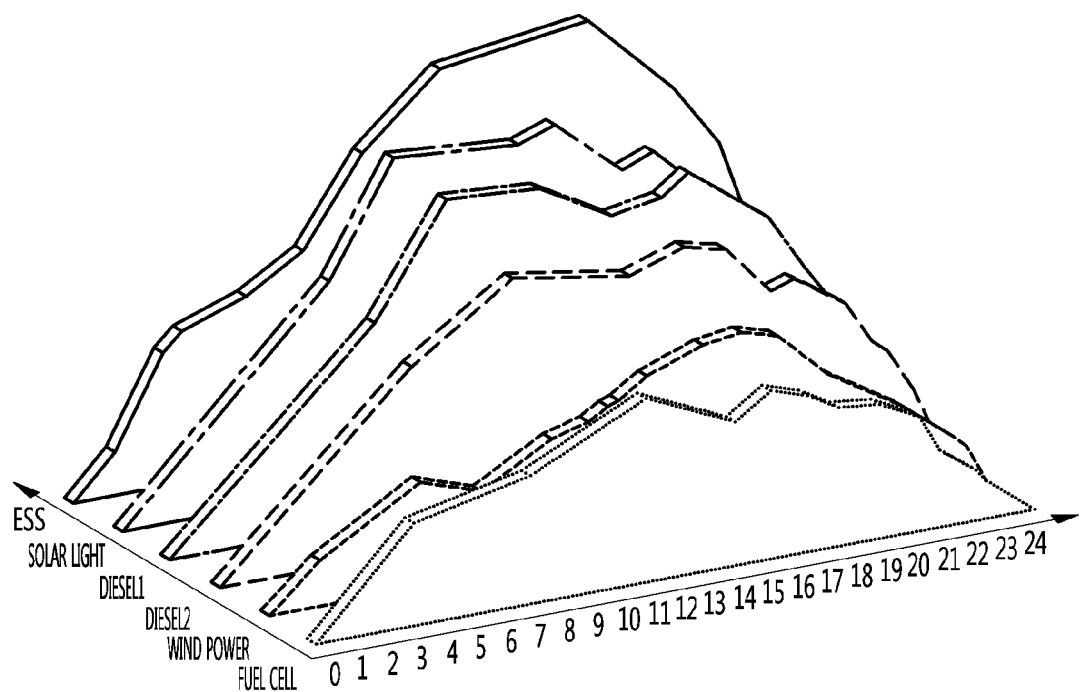
Figure 18C:
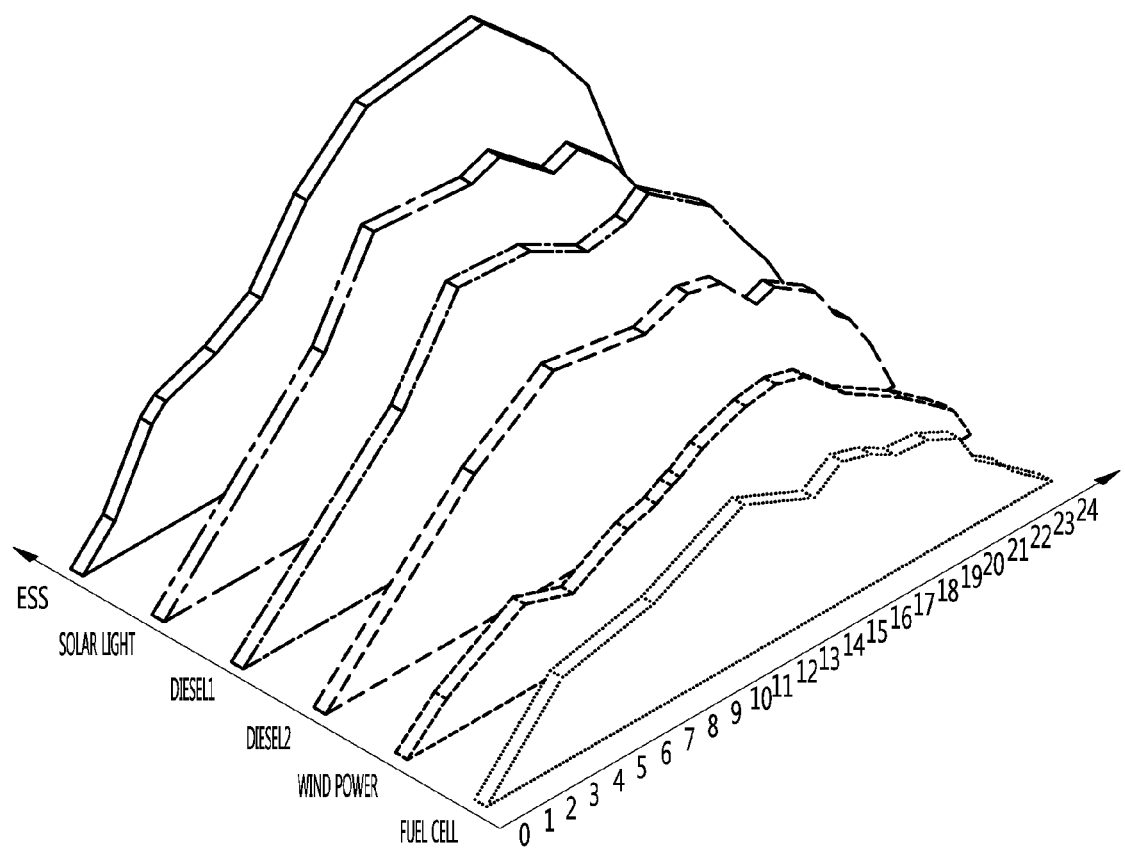

Next, referring to FIG. 18A, the controller 18 may receive a command for selecting a first area 1801 of the graph of broken line using the pointer 1000 and dragging and dropping the pointer to a third area 1803. The pointer 1000 may move from the first area 1801 to the third area 1803 through the second area 1802.

The controller 18 may change the graph to the three-dimensional energy graph and display the energy graph while the pointer 1000 moves from the first area 1801 to the third area 1803 through the second area 1802.

Specifically, the controller 18 may display the three-dimensional energy graph immediately upon receiving the command for selecting the first area 1801 and performing dragging in the graph of broken line. Thereafter, the controller 18 may change the display direction of the three-dimensional energy graph according to the drag direction and the drag distance. For example, the controller 18 may display the graph shown in FIG. 18B when the pointer 1000 is located in the second area 1803. Thereafter, the controller 18 may display the energy graph shown in FIG. 18C when the pointer 1000 is located in the third area 1803.

Figure 19A:
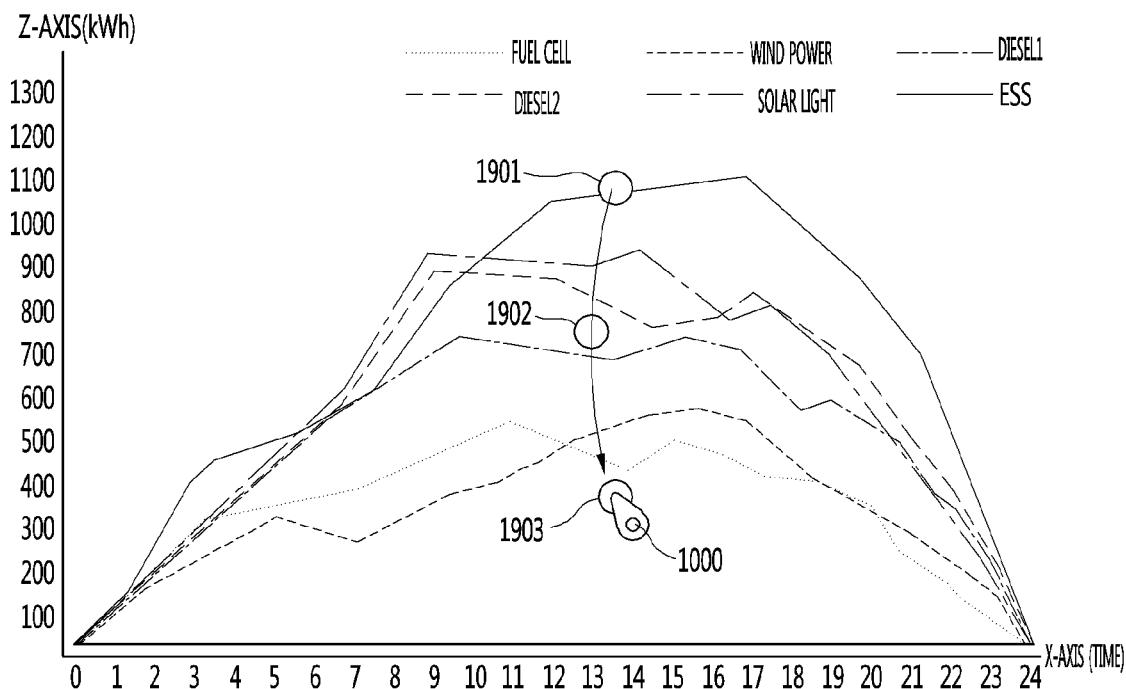
FIGS. 19A to 19C are diagrams illustrating a method of changing the display direction of an energy graph at an energy management apparatus according to an embodiment of the present invention.

Meanwhile, referring to FIG. 19A, the controller 18 may receive a command for dragging and dropping the pointer from a first area 1901 corresponding to the upper center of the graph of broken line to a third area 1903 corresponding to the lower center of the graph of broken line. The pointer 1000 may move from the first area 1901 to the third area 1903 through a second area 1902.

The controller 18 may change and display the energy graph while the pointer 1000 moves from the first area 1901 to the third area 1903 through the second area 1902.

Specifically, when a command for selecting the first area 1901 in the graph of broken line and performing dragging is received, the controller 18 may change the graph to the three-dimensional energy graph and display the three-dimensional energy graph. Thereafter, the controller 18 may change the display direction of the three-dimensional energy graph according to the drag direction and the drag distance.

Figure 19B:
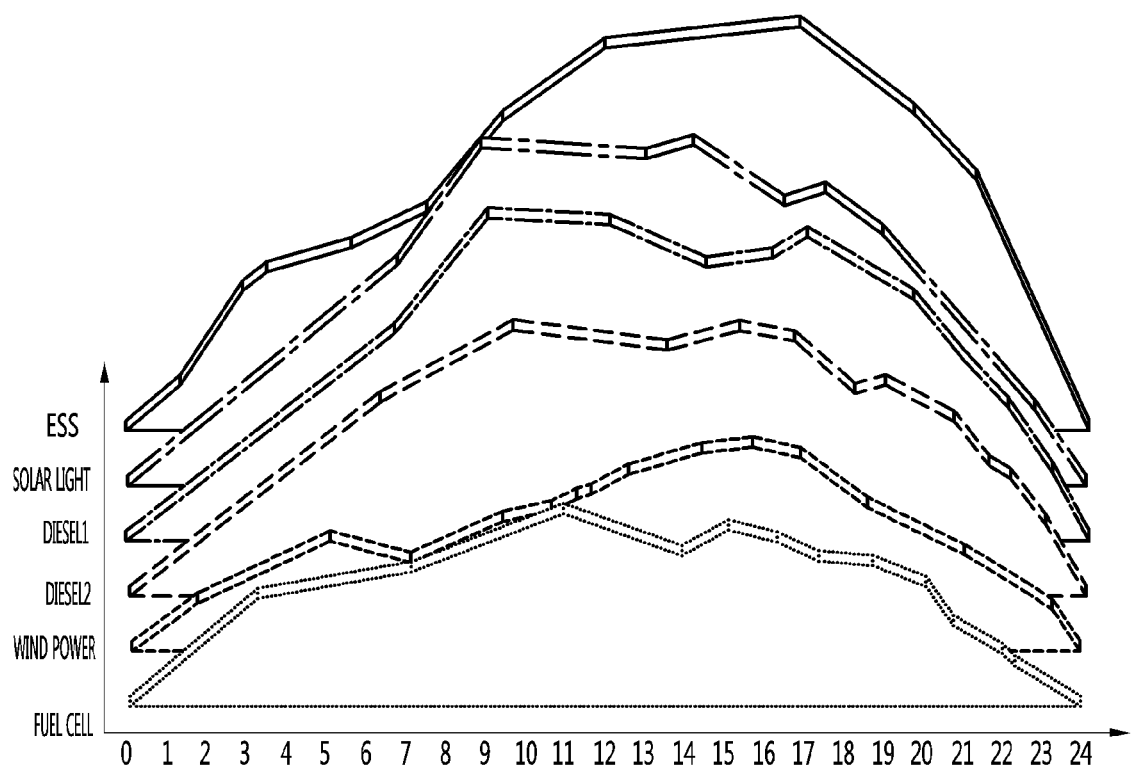
Figure 19C:
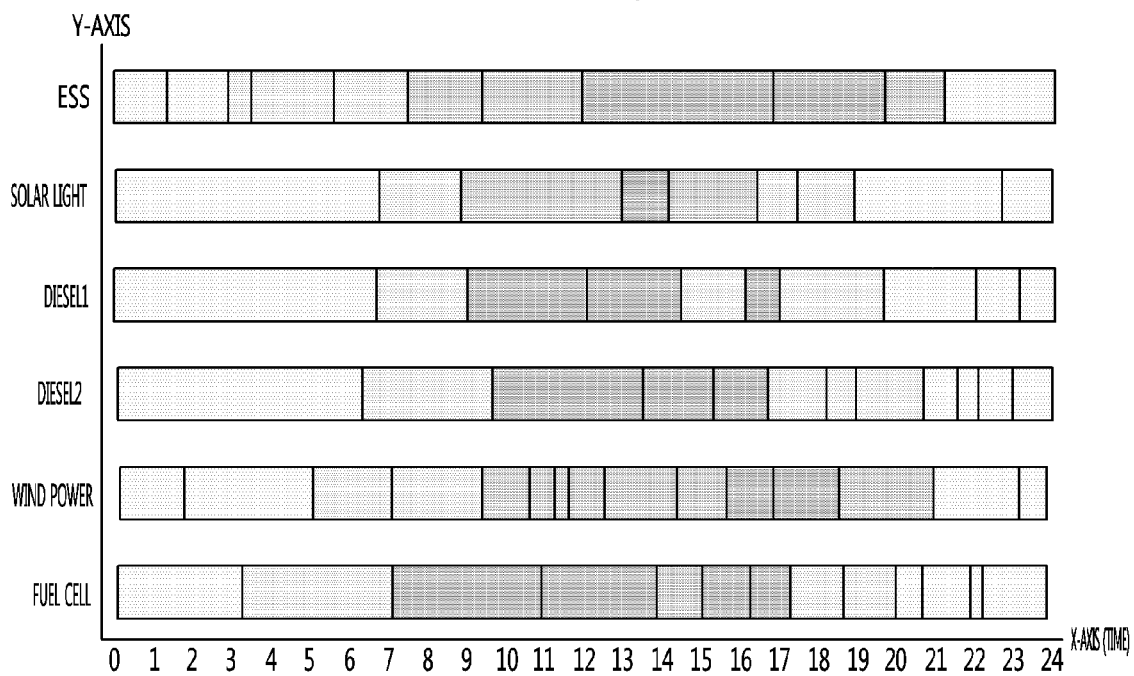

For example, the controller 18 may display the graph shown in FIG. 19B when the pointer 1000 is located in the second area 1902. Thereafter, the controller 18 may display the energy graph shown in FIG. 19C when the pointer 1000 is located in the third area 1903.

The controller 18 may change the graph of broken line to the three-dimensional energy graph and then change the three-dimensional energy to the horizontal bar graph again according to the drag direction and the drag distance. However, this is an example and the form of the graph may be changed according to the drag direction and the drag distance.

In addition, as shown in FIGS. 18A to 18C and FIGS. 19A to 19C, the controller 18 may change the same energy graph to different energy graphs according to the drag direction and the drag distance. Accordingly, the user may variously change and analyze the energy graph according to the energy analysis subject.

Figure 20A:
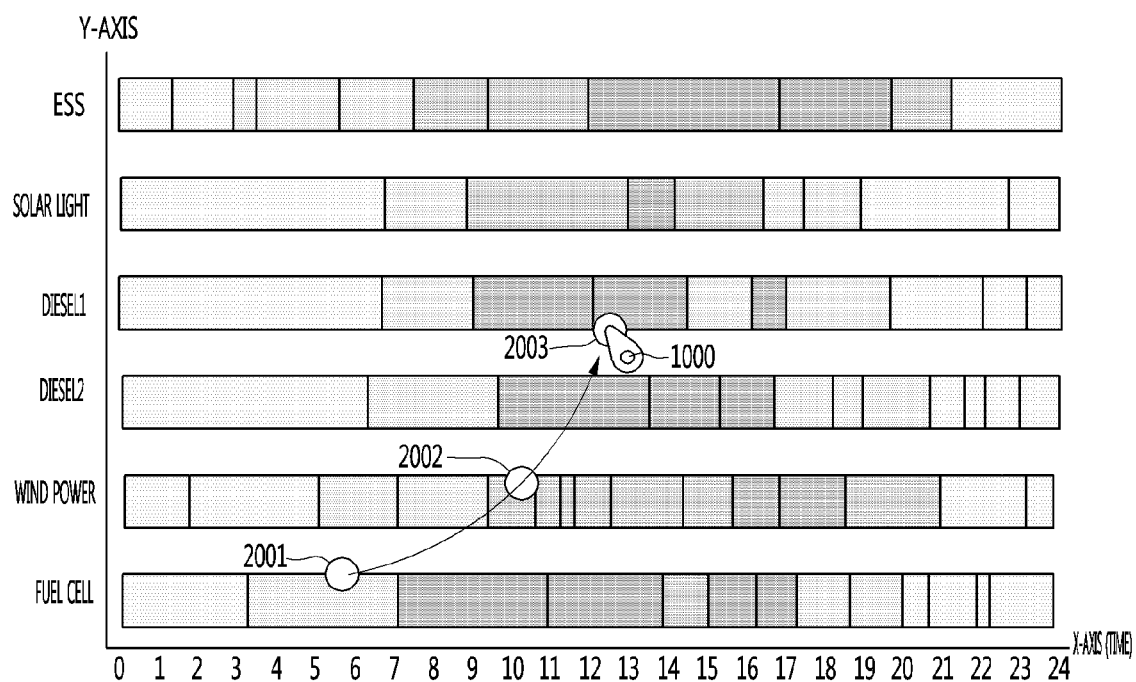
FIGS. 20A to 20C are diagrams illustrating a method of changing the display direction of an energy graph at an energy management apparatus according to an embodiment of the present invention.
Figure 20B:
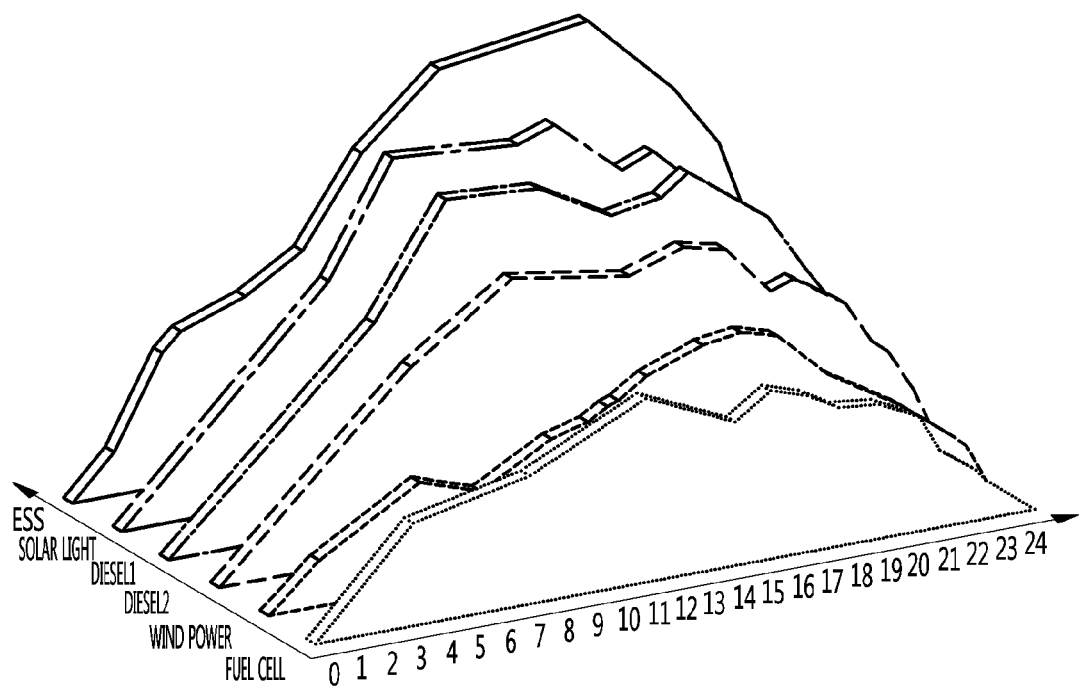
Figure 20C:
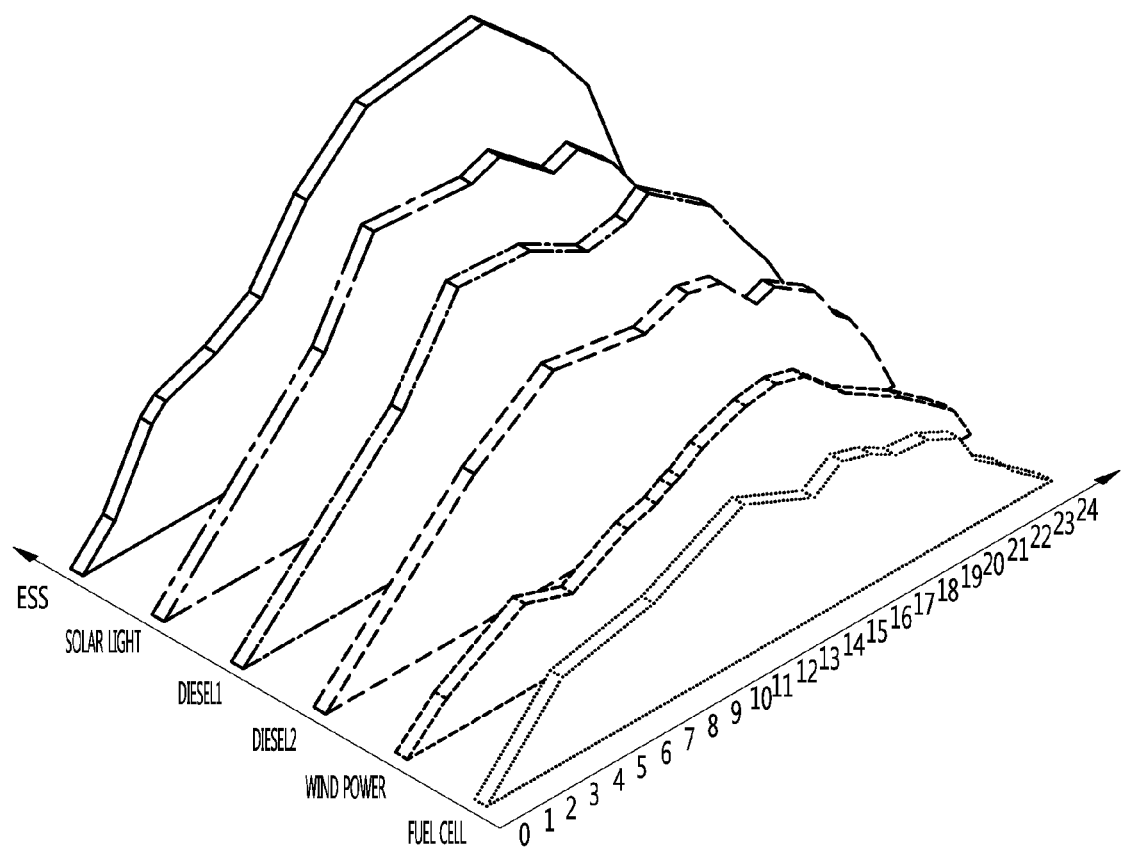

Next, referring to FIG. 20A, the controller 18 may receive a command for dragging and dropping the pointer 1000 from a first area 2001 corresponding to the lower left side of the horizontal bar graph to a third area 2003 corresponding to the center. The pointer 1000 may move from the first area 2001 to the third area 2003 through a second area 2002.

The controller 18 may change, rotate and display the energy graph while the pointer 1000 moves from the first area 2001 to the third area 2003 through the second area 2002.

Specifically, when a command for selecting the first area 2001 in the horizontal bar graph and performing dragging is received, the controller 18 may change the energy graph to the three-dimensional energy graph and display the three-dimensional energy graph. Thereafter, the controller 18 may rotate the three-dimensional energy graph and display the graph shown in FIG. 20B when the pointer 1000 is located in the second area 2002. Thereafter, the controller 18 may display the graph shown in FIG. 20C when the pointer 1000 is located in the third area 2003. The controller 18 may change the horizontal bar graph to the three-dimensional energy graph and change and display the rotation direction of the three-dimensional energy graph.

The drag-and-drop commands shown in FIGS. 17A to 17C, FIGS. 18A to 18C, FIGS. 19A to 19C and FIGS. 20A to 20C are examples of the present invention and the pointer of the energy management apparatus may be dragged and dropped in all directions by all distances.

In this manner, the user can more freely analyze the energy operation state of the system in detail while changing the energy graph 600 displayed on the display unit 15 as necessary.

While the present invention has been particularly shown and described with reference to exemplary embodiments thereof, it should be understood by those skilled in the art that the invention is not limited to the disclosed exemplary embodiments but various modifications may be made without departing from the spirit and scope of the present invention. Such modifications should not be individually understood from the technical spirit or prospect of the present invention.

According to an embodiment of the present invention, the above-described method may be implemented as code that can be written to a processor-readable recording medium and can thus be read by a processor. Examples of the processor-readable recording medium include a ROM, a RAM, a CD-ROM, a magnetic tape, a floppy disk, an optical data storage device, etc.

The above-described energy management apparatus is not restrictively applied to the above-described energy management apparatus, but all or portions of the above-described embodiments may be selectively combined such that various modifications may be made.

The invention claimed is:

1. An energy management apparatus comprising:
a measurement unit configured to acquire power state information of at least one a plurality of energy devices configuring a system to which the energy management apparatus belongs;
a controller configured to:
analyze an energy operation state of the plurality of energy devices based on the acquired power state information, and
generate a three-dimension energy graph corresponding to the analyzed energy operation state; and
a display unit configured to display the generated three-dimensional energy graph,
wherein an X-axis, a Y-axis and a Z-axis of the three-dimensional energy graph are respectively mapped to a time, an energy device and an energy analysis object,
wherein the controller is further configured to generate the three-dimensional energy graph with a color varying according to the energy device and a chroma varying according to a value of the energy analysis object corresponding to the energy operation state, and
wherein the energy analysis object is one of the amount of generated energy, the amount of consumed energy and the energy efficiency.

2. The energy management apparatus according to claim 1, wherein, when a display method change command is received, the controller changes the three-dimensional energy graph to any one of an XY-axis graph, an XZ-axis graph or a YZ-axis graph.

3. The energy management apparatus according to claim 2, wherein the XY-axis graph is a horizontal bar graph and the horizontal bar graph is displayed with chroma varying according to data corresponding to the Z-axis.

4. The energy management apparatus according to claim 2, wherein the XZ-axis graph is a graph of broken line.

5. The energy management apparatus according to claim 2, wherein the YZ-axis graph is a vertical bar graph and the vertical bar graph indicates a maximum value of data corresponding to the Z-axis.

6. The energy management apparatus according to claim 5, wherein the YZ-axis graph further includes time information when the data corresponding to the Z-axis has a maximum value.

7. The energy management apparatus according to claim 2, wherein the controller changes the changed graph to the three-dimensional energy graph when a command for dragging and dropping an area of the changed graph is received.

8. The energy management apparatus according to claim 1, wherein the controller changes a display direction of the three-dimensional energy graph when a command for dragging and dropping an area of the changed graph is received.

9. The energy management apparatus according to claim 1, wherein, when the energy operation state is the amount of generated energy, the X-axis indicates a time, the Y-axis indicates an energy supply device and the Z-axis indicates the amount of generated energy.

10. The energy management apparatus according to claim 2, wherein, upon detecting that a pointer is located in an area of the graph displayed on the display unit, the controller displays energy information corresponding to the area, in which the pointer is located, in a popup window through the display unit.

11. The energy management apparatus according to claim 10, wherein the energy information includes at least one of time information, energy device information or energy amount information.

12. A method of operating an energy management apparatus, the method comprising:
acquiring power state information of a plurality of energy devices configuring a system to which the energy management apparatus belongs;
analyzing an energy operation state of the plurality of energy devices based on the acquired power state information;
generating a three-dimension energy graph corresponding to the analyzed energy operation state; and
displaying the generated three-dimensional energy graph,
wherein an X-axis, a Y-axis and a Z-axis of the three-dimensional energy graph are respectively mapped to a time, an energy device and an energy analysis object,
wherein the energy analysis object is one of the amount of generated energy, the amount of consumed energy and the energy efficiency, and
wherein the generating the three-dimension energy graph is further comprises:
generating the three-dimension energy graph with a color varying according to the energy device and a chroma varying according to a value of the energy analysis object corresponding to the energy operation state.

13. The method according to claim 12, further comprising, when a display method change command is received, changing the three-dimensional energy graph to any one of an XY-axis graph, an XZ-axis graph or a YZ-axis graph.

* * * * *